United States Patent
Vergeer

(10) Patent No.: US 9,760,028 B2
(45) Date of Patent: Sep. 12, 2017

(54) LITHOGRAPHY SYSTEM AND METHOD FOR PROCESSING A TARGET, SUCH AS A WAFER

(71) Applicant: MAPPER LITHOGRAPHY IP B.V., Delft (NL)

(72) Inventor: Niels Vergeer, Rotterdam (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 159 days.

(21) Appl. No.: 14/383,570

(22) PCT Filed: Mar. 8, 2013

(86) PCT No.: PCT/EP2013/054782
§ 371 (c)(1),
(2) Date: Sep. 8, 2014

(87) PCT Pub. No.: WO2013/132081
PCT Pub. Date: Sep. 12, 2013

(65) Prior Publication Data
US 2015/0109598 A1     Apr. 23, 2015

Related U.S. Application Data

(60) Provisional application No. 61/608,524, filed on Mar. 8, 2012.

(51) Int. Cl.
*G03B 27/58*     (2006.01)
*G03F 9/00*     (2006.01)
(Continued)

(52) U.S. Cl.
CPC ............... *G03F 9/00* (2013.01); *B82Y 10/00* (2013.01); *B82Y 40/00* (2013.01); *G03F 9/7088* (2013.01);
(Continued)

(58) Field of Classification Search
CPC .... G03F 7/70633; G03F 7/70641; G03F 9/00; G03F 9/7088; G03F 9/7026;
(Continued)

(56) References Cited

U.S. PATENT DOCUMENTS 5,920,378 A    7/1999  Murakami et al.
6,198,527 B1   3/2001  Nishi
(Continued)

FOREIGN PATENT DOCUMENTS

CN    101158818 A    4/2008
CN    101487985 A    7/2009
(Continued)

*Primary Examiner* — Peter B Kim
(74) *Attorney, Agent, or Firm* — Hoyng Rokh Monegier LLP; David P. Owen

(57) ABSTRACT

A method for operating a target processing system for processing a target (23) on a chuck (13), the method comprising providing at least a first chuck position mark (27) and a second chuck position mark (28) on the chuck (13); providing an alignment sensing system (17) arranged for detecting the first and second chuck position marks (27, 28), the alignment sensing system (17) comprising at least a first alignment sensor (61) and a second alignment sensor (62); moving the chuck (13) to a first position based on at least one measurement of the alignment sensing system (17); and measuring at least one value related to the first position of the chuck.

17 Claims, 13 Drawing Sheets

(51) Int. Cl.
*H01J 37/317* (2006.01)
*B82Y 10/00* (2011.01)
*B82Y 40/00* (2011.01)
*H01J 37/304* (2006.01)

(52) U.S. Cl.
CPC ....... *H01J 37/3177* (2013.01); *H01J 37/3045* (2013.01); *H01J 2237/30438* (2013.01)

(58) Field of Classification Search
CPC .......... G03F 9/7019; H01J 2237/30438; H01J 37/3045; H01J 37/3177
USPC .......................................................... 355/72
See application file for complete search history.

(56) References Cited

U.S. PATENT DOCUMENTS

| | | | |
|---|---|---|---|
| 6,341,007 B1* | 1/2002 | Nishi | G03F 7/70216 355/53 |
| 2005/0219489 A1* | 10/2005 | Nei | G03F 7/70341 355/53 |
| 2006/0221318 A1 | 10/2006 | Tsutsumi | |
| 2008/0043212 A1 | 2/2008 | Shibazaki | |
| 2008/0079920 A1* | 4/2008 | Hommen | G03F 7/7085 355/55 |
| 2009/0033896 A1* | 2/2009 | Nagasaka | G03F 7/70341 355/53 |
| 2009/0073405 A1* | 3/2009 | Kanaya | G03F 7/70725 355/53 |
| 2009/0103067 A1* | 4/2009 | Takenaka | G03B 27/42 355/53 |
| 2011/0090476 A1 | 4/2011 | Van De Kerkhof et al. | |
| 2012/0268724 A1 | 10/2012 | de Boer et al. | |
| 2012/0268725 A1 | 10/2012 | De Boer et al. | |

FOREIGN PATENT DOCUMENTS

| | | |
|---|---|---|
| EP | 0951054 A1 | 10/1999 |
| EP | 1091385 A1 | 11/2001 |
| EP | 1 168 085 A2 | 1/2002 |
| JP | 11195584 | 7/1999 |
| JP | 2004311659 | 4/2004 |
| WO | WO 2011 080311 A1 | 7/2011 |

* cited by examiner

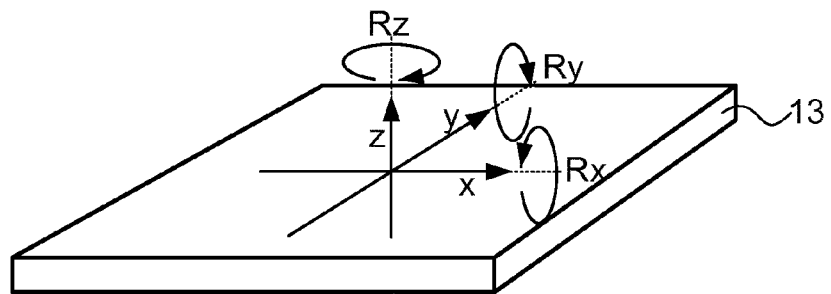
FIG. 5
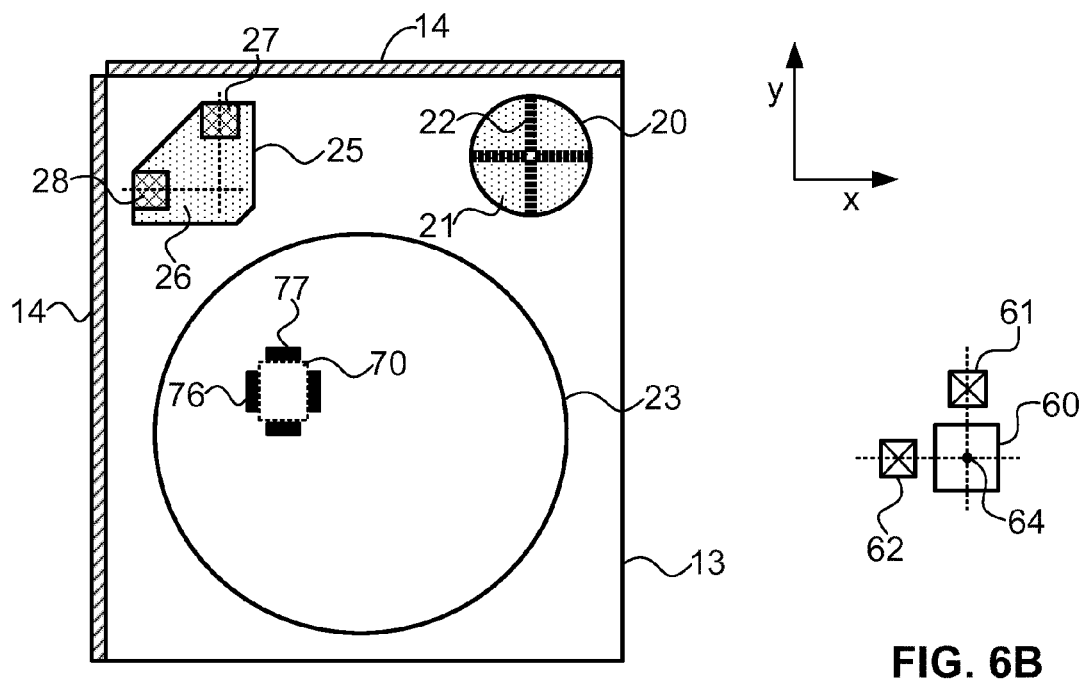
FIG. 6A
FIG. 6B

# LITHOGRAPHY SYSTEM AND METHOD FOR PROCESSING A TARGET, SUCH AS A WAFER

BACKGROUND OF THE INVENTION

1. Field of the Invention

The invention relates to a lithography system for processing a target, such as a wafer, and a method for operating a lithography system for processing a target, such as a wafer.

2. Description of the Related Art

Systems for processing a target are known in the art, usually comprising a final projection system for projecting a pattern on the target surface and a system for determining the position of a wafer with respect to the final projection system. In general, these systems may use position marks on the wafer. Between a first and a second session of projecting a pattern, it may be required to remove the wafer from the lithography system. In that case, it may be required that the position of the pattern of the second session is matched with the position of the pattern of the first session and that the position of the wafer with respect to the final projection system (or the patterning beam) may have to be determined twice, at the beginning of each session. However, it may be difficult to determine the position of the wafer with respect to the final projection system with a high reproducibility.

BRIEF SUMMARY OF THE INVENTION

It is an object of the present invention to provide an improved lithography system and method for processing a target, such as a wafer. The invention includes a method for operating a target processing system for processing a target on a chuck, the method comprising providing at least a first chuck position mark and a second chuck position mark on the chuck; providing an alignment sensing system arranged for detecting the first and second chuck position marks, the alignment sensing system comprising at least a first alignment sensor and a second alignment sensor; moving the chuck to a first position based on at least one measurement of the alignment sensing system; and measuring at least one value related to the first position of the chuck.

The relative position of the first chuck position mark with respect to the second chuck position mark may be substantially the same as the relative position of the first alignment sensor with respect to the second alignment sensor. The alignment system may be arranged for measuring of the chuck position marks in a substantially horizontal direction (x, y direction). The method may further comprise providing a final projection system arranged to project a patterning beam onto the target, and wherein the first alignment sensor is arranged at a distance from the final projection system in a first direction and the second alignment sensor is arranged at distance from the final projection system in a second direction. In this way, the alignment sensors may be arranged along perpendicular x- and y-axes to provide a faster determination of position of the chuck position marks in both dimensions.

The method may comprise projecting a patterning beam onto the target to form a beam grid on the target, wherein the first alignment sensor is arranged for detecting a position mark at a distance from the beam grid in a first direction and the second alignment sensor is arranged for detecting a position mark at a distance from the beam grid in a second direction. In this arrangement, the alignment sensors are arranged along perpendicular x- and y-axes with respect to the beam grid projected onto the target, to provide a faster determination of position of the chuck position marks in both dimensions.

The method may comprise projecting a patterning beam onto the target to form a beam grid on the target, wherein the alignment sensing system comprises one or more alignment sensors arranged for detecting a position mark at distance from the beam grid, and wherein the method further comprises determining a spatial relationship between the one or more alignment sensors and the beam grid. The step of determining a spatial relationship between the one or more alignment sensors and the beam grid may comprise determining a vector for each alignment sensor describing the position of the alignment sensor relative to the beam grid in a substantially horizontal direction (e.g. an x, y direction).

The alignment sensing system may comprise at least one alignment sensor for detecting a position mark on a surface of the target and/or the chuck, and the alignment sensor may comprise a light source arranged for providing an alignment light beam; a light intensity detector arranged for determining a light intensity of a reflected alignment light beam, wherein the reflected alignment light beam is generated by reflection of the alignment light beam by the surface; and an optical system arranged for focusing the alignment light beam on the surface and for guiding the reflected alignment light beam on the light intensity detector.

The step of measuring at least one value relating to the first position of the chuck may comprise moving the chuck to align the chuck position marks with the alignment sensors, and measuring at least one value related to the current position of the chuck. The step of moving the chuck to align the chuck position marks with the alignment sensors may comprise moving the chuck in two horizontal axes (e.g. x- and y-axes) and rotating the chuck about a vertical axis (e.g. Rz direction) as necessary to achieve the alignment.

Aligning the chuck position marks with the alignment sensors may comprise performing a minimum least squares fit of the alignment of a first chuck position mark with a first alignment sensor, and a second chuck position mark with a second alignment sensor.

A chuck position measurement system may be provided comprising at least two interferometers, wherein measuring at least one value related to the first position of the chuck comprises measuring an output of the interferometers. The method may further comprise initializing the interferometers with the chuck located at the first position. The method may further comprise storing the at least one measured value related to a first position of the chuck as a chuck initialization position.

A level sensing system may be provided comprising a plurality of level sensors, and a reference surface may be provided on the chuck, the method further including measuring at least one value relating to the orientation of the reference surface with respect to the level sensors. The method may further comprise moving the chuck to align the reference surface with a level sensor plane of the level sensors prior to measuring at least one value relating to orientation of the beam grid. This enables the tilt of the chuck to be corrected or aligned to simply subsequent measurements and processing. The step of moving the chuck to align the reference surface with a level sensor plane of the level sensors may comprise measuring a distance from the first level sensor to the reference surface and measuring a distance from the second level sensor to the reference surface, and moving the chuck as necessary so that the reference surface coincides with the level sensor plane. The level sensing system may be arranged for measuring a distance to the surface in a substantially vertical direction (e.g. a z direction). The level sensing system may comprise a differential capacitive sensing system. The level sensing system may comprise at least a first level sensor arranged at a distance from the final projection system in a first direction and a second level sensor arranged at distance from the final projection system in a second direction.

The alignment sensing system may comprise at least one alignment sensor and the level sensing system may comprise at least one level sensor, and the at least one alignment sensor may be arranged to detect a position mark on the surface at a first point and the at least on level sensor may be arranged for measuring distance to the surface at the first point or adjacent to the first point.

The method may further comprising measuring a position of a nominal target center for a target loaded directly or indirectly on the chuck with respect to the alignment sensing system. The method may further comprise moving the chuck to a second position based at least in part on the measured value related to the first position of the chuck, and measuring at least one value related to the second position of the chuck. The method may further comprise providing a reference target having a target position mark at a center position of the reference target; moving the chuck to align the center position with at least one of the alignment sensors; and measuring a current position of the chuck. The method may include determining a relative position of the center position of the reference target with respect to each of the alignment sensors, e.g. by calculating a vector.

The invention also relates to a method, which may be performed additionally to or separately from the above-described method, the method comprising the steps of generating a patterning beam, the patterning beam having a focal length on a focal plane, moving the chuck to position the beam position sensor under the patterning beam, the patterning beam forming a beam grid on the beam position sensor, and measuring at least one value relating to orientation of the beam grid on the beam position sensor. The step of generating the patterning beam may comprise generating a plurality of sub-beams, the sub-beams being arranged in a grid formation. The method may further comprise providing at least one blocking feature on the beam position sensor, and the step of measuring at least one value relating to orientation of the beam grid on the beam position sensor may comprises sweeping the patterning beam across the at least one blocking feature of the beam position sensor.

The step of generating the patterning beam may comprise generating a plurality of sub-beams arranged in a grid formation, the step of providing at least one blocking feature on the beam position sensor may comprise providing a plurality of blocking features arranged on the beam position sensor at relative spatial positions corresponding to the nominal relative spatial positions of the sub-beams, and the step of sweeping the patterning beam may comprise sweeping the plurality of sub-beams across corresponding ones of the plurality of blocking features.

The target may have a first pattern and target position marks formed on a surface, the method further comprising aligning the chuck and the beam grid based on the at least one measured value relating to orientation of the chuck and the at least one measured value relating to orientation of the beam grid. The step of aligning the chuck and the beam grid may comprise rotating the chuck about a vertical axis (e.g. the Rz direction). The step of measuring at least one value relating to orientation of the chuck with respect to the alignment sensors may comprise determining a substantially horizontal chuck axis, wherein the step of generating the patterning beam comprises generating a plurality of sub-beams arranged in a grid formation, the sub-beams being arranged relative to a substantially horizontal beam grid axis, and wherein the step of aligning the chuck and the beam grid comprises aligning the chuck axis parallel to the beam grid axis.

The invention further relates to a method, which may be performed additionally to or separately from the above-described methods, the method comprising the steps of aligning the surface of the target with the focal plane of the patterning beam. The step of aligning the surface of the target with the focal plane of the patterning beam may comprise moving the chuck substantially horizontal in two dimensions (x, y directions) as necessary to position an origin of the chuck under an origin of the beam grid, and moving the chuck in a substantially vertical direction (z direction) as necessary to position the origin of the chuck in the focal plane of the final projection system. The method may further comprise rotating the chuck about a substantially horizontal axis (Rx, Ry direction) as necessary to align the reference surface to a level sensor plane.

The method may further comprise rotating the chuck about a substantially vertical axis (Rz direction) as necessary to align an axis of the chuck with an axis of the beam grid, and may comprise calibrating the level sensors to a level sensor plane coinciding with the focal plane. The method may further comprise measuring at least one value relating to orientation of a first pattern formed on the target.

The invention further relates to a method, which may be performed additionally to or separately from the above-described methods, the method comprising the steps of measuring an offset of a center position of the first pattern on the target with respect to a nominal center position for the target, and calculating at least one value relating to a position of the target position marks with respect to the alignment sensing system based on the offset and the position of the target position marks with respect to the target.

The step of measuring at least one value relating to orientation of the first pattern beam grid in the above-described methods may further comprise moving the chuck to position a center position of the first pattern on the target under the first alignment sensor; moving the chuck to position a first target position mark under a first alignment sensor; and determining a position of the first target position mark with respect to the beam grid. The method may further comprise moving the chuck to position the center of the target under the second alignment sensor; moving the chuck to position a second target position mark under a second alignment sensor; and determining a position of the second target position mark with respect to the beam grid.

The above-described methods may further comprise aligning the first pattern formed on the surface with the beam grid based on the at least one measured value relating to orientation of the first pattern and the at least one measured value relating to orientation of the beam grid. The methods may include rotating the target to align an axis (y-axis) of the first target pattern with a corresponding axis (y-axis) of the beam grid, and may further include forming a second pattern on the surface with the patterning beam.

The invention also relates to a method for forming a second pattern on a target with a patterning beam, the second pattern being aligned with a first pattern previously formed on a surface of the target, the method comprising providing a lithography system for generating the patterning beam, the lithography system comprising a final projection system for projecting the patterning beam onto the surface, and further comprising an alignment sensing system and a level sensing system; and providing a chuck, the chuck comprising chuck position marks and a beam position sensor. The method includes the steps of moving the chuck to a first position based on at least one measurement of the alignment sensing system and measuring at least one value related to the first position of the chuck; measuring a position of a nominal center of a target loaded directly or indirectly on the chuck with respect to the alignment sensing system; generating the patterning beam, the patterning beam having a focal length on a focal plane; moving the chuck to position the beam position sensor under the patterning beam, the patterning beam forming a beam grid on the beam position sensor; and measuring at least one value relating to orientation of the beam grid on the beam position sensor. The method may further include the steps of positioning the target directly or indirectly on the chuck, the target having a surface and having a first pattern and target position marks formed on the surface; aligning the chuck and the beam grid based on the at least one measured value relating to orientation of the chuck and the at least one measured value relating to orientation of the beam grid; aligning the surface of the target with the focal plane of the patterning beam; measuring at least one value relating to orientation of the first pattern; aligning the first pattern formed on the surface with the beam grid based on the at least one measured value relating to orientation of the first pattern and the at least one measured value relating to orientation of the beam grid; and forming the second pattern on the surface with the patterning beam.

The invention further relates to a method for determining a spatial relationship of a pattern with respect to a beam grid, wherein the pattern is formed on a surface of a target and the target is positioned directly or indirectly on a chuck, and wherein the beam grid is formed by projecting a patterning beam onto the surface. The method comprises moving the chuck to a first position and measuring at least a first value relating to a spatial relationship of the chuck with respect to a reference coordinate frame; moving the chuck to a second position, the chuck movement based at least in part on the first value, and measuring at least one value relating to a spatial relationship of the target with respect to the reference coordinate frame; moving the chuck to a third position, the chuck movement based at least in part on the first value, and measuring at least one value relating to a spatial relationship of the beam grid with respect to the reference coordinate frame; moving the chuck to a fourth position, the chuck movement based at least in part on the first value, the second value, and the third value, and measuring at least one value relating to a spatial relationship of the pattern with respect to the reference coordinate frame.

In yet another aspect, the invention relates to a target processing system for processing a target on a chuck, the system comprising: a moveable chuck including at least a first chuck position mark and a second chuck position mark; an alignment sensing system arranged for detecting the first and second chuck position marks, the alignment sensing system comprising at least a first alignment sensor and a second alignment sensor, an actuator arranged for moving the chuck to a first position based on at least one measurement of the alignment sensing system; and a measurement system arranged for measuring at least one value related to the first position of the chuck.

The relative position of the first chuck position mark with respect to the second chuck position mark may be substantially the same as the relative position of the first alignment sensor with respect to the second alignment sensor. The alignment system may be arranged for measuring of the chuck position marks in a substantially horizontal direction (x, y direction). The system may further comprise a final projection system arranged to project a patterning beam onto the target, and wherein the first alignment sensor is arranged at a distance from the final projection system in a first direction (y-axis) and the second alignment sensor is arranged at distance from the final projection system in a second direction (x-axis).

The system may further comprising a final projection system for projecting a patterning beam onto the target to form a beam grid on the target, wherein the first alignment sensor is arranged for detecting a position mark at a distance from the beam grid in a first direction (y-axis) and the second alignment sensor is arranged for detecting a position mark at a distance from the beam grid in a second direction (x-axis).

The system may further comprise a final projection system for projecting a patterning beam onto the target to form a beam grid on the target, wherein the alignment sensing system comprises one or more alignment sensors arranged for detecting a position mark at distance from the beam grid, and wherein the system further comprises a measurement system for determining a spatial relationship between the one or more alignment sensors and the beam grid.

The measurement system may be arranged to determine a spatial relationship between the one or more alignment sensors and the beam grid by determining a vector for each alignment sensor describing the position of the alignment sensor relative to the beam grid in a substantially horizontal direction (x, y direction). The alignment sensing system may comprise at least one alignment sensor for detecting a position mark on a surface of the target and/or the chuck, the alignment sensor comprising a light source arranged for providing an alignment light beam; a light intensity detector arranged for determining a light intensity of a reflected alignment light beam, wherein the reflected alignment light beam is generated by reflection of the alignment light beam by the surface; and an optical system arranged for focusing the alignment light beam on the surface and for guiding the reflected alignment light beam on the light intensity detector.

The chuck may comprise at least two chuck position marks on the chuck, and wherein the measurement system is arranged for measuring at least one value relating to the first position of the chuck including moving the chuck to align the chuck position marks with the alignment sensors; and measuring at least one value related to the current position of the chuck. The measurement system and chuck actuator may be arranged for moving the chuck to align the chuck position marks with the alignment sensors including moving the chuck in two horizontal axes (x, y-axis) and rotating the chuck about a vertical axis (Rz direction) as necessary to achieve the alignment.

The system may be arranged for aligning the chuck position marks with the alignment sensors, comprising performing a minimum least squares fit of the alignment of a first chuck position mark with a first alignment sensor, and a second chuck position mark with a second alignment sensor. The system may further comprising a chuck position measurement system comprising at least two interferometers, and wherein measuring at least one value related to the first position of the chuck comprises measuring an output of the interferometers. The system may be arranged for initializing the interferometers with the chuck located at the first position. The measurement system may be arranged for storing the at least one measured value related to a first position of the chuck as a chuck initialization position.

The system may further comprise a level sensing system comprising a plurality of level sensors, and a reference surface on the chuck, the system arranged for measuring at least one value relating to the orientation of the reference surface with respect to the level sensors. The measurement system and actuator may be arranged for moving the chuck to align the reference surface with a level sensor plane of the level sensors prior to measuring at least one value relating to orientation of the beam grid.

The level sensing system may be arranged to measure a distance from the first level sensor to the reference surface and measuring a distance from the second level sensor to the reference surface; and the actuator is arranged to move the chuck as necessary so that the reference surface coincides with the level sensor plane. The level sensing system may be arranged for measuring a distance to the surface in a substantially vertical direction (z direction). The level sensing system may comprise a differential capacitive sensing system. The level sensing system may comprise at least a first level sensor arranged at a distance from the final projection system in a first direction (y-axis) and a second level sensor arranged at distance from the final projection system in a second direction (x-axis).

BRIEF DESCRIPTION OF THE DRAWINGS

The invention will be described in view of exemplary embodiments shown in the attached drawings, in which:

FIG. 5 is a diagram of a possible definition of x, y and z directions and Rx, Ry and Rz rotational directions in a lithography system;

FIG. 6A shows a schematic top view of an embodiment of a chuck;

FIG. 6B shows a schematic top view of a spatial relationship between alignment sensors and a beam grid in an embodiment of the invention;

DESCRIPTION OF ILLUSTRATIVE EMBODIMENTS

Figure 1:
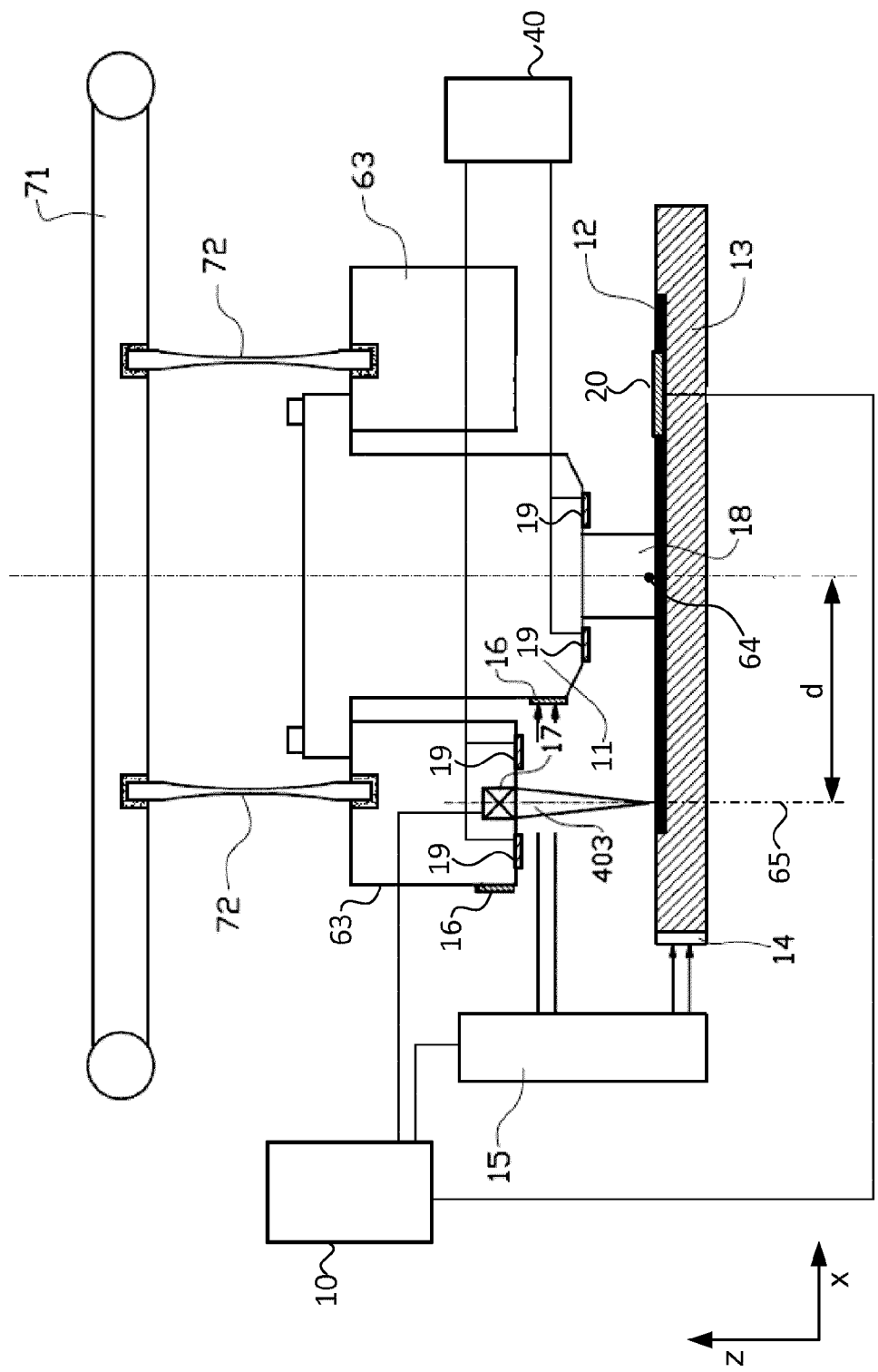
FIG. 1 is a schematic cross-sectional diagram of a portion of an embodiment of a lithography system according to the invention.

The following is a description of certain embodiments of the invention, given by way of example only and with reference to the drawings. Referring to FIG. 1, a schematic overview showing a cross-section of a lithography system is provided. A final projection system 11 may be arranged for receiving a beam from a beam source and projecting a patterning beam 18 onto a surface 12. The beam source is not shown in FIG. 1, but an example may be seen in FIG. 15. The final projection system 11 may comprise collimators, lenses, deflectors and/or other (electro)-optical elements to shape and/or direct the patterning beam. The final projection system 11 may be a (final) part of a projection column, the projection column comprising the beam source, deflector, beam switching and/or other (electro)-optical elements. The projection column may be an optical projection column or a charged particle optical projection column.

The patterning beam 18 is directed towards a surface 12. The surface 12 may be surface of a target, such as a wafer, or the measuring surface of a sensor such as a beam measurement sensor 20. The beam measurement sensor and/or the target/wafer may be provided on a chuck 13, either directly on the chuck or on another element which is on the chuck. The chuck 13 may be moveable in at least one dimension and preferably in multiple dimensions.

The lithography system may be provided with an actuator system for moving the chuck in one or more dimensions. The actuator system typically comprises a long stroke and short stroke stage which together accomplish these movements, and may be of the type typically used in lithography systems.

The final projection system 11 is arranged for focusing the patterning beam 18 onto a focal plane, and the lithography system is arranged for bringing the surface 12 onto the focal plane. The patterning beam 18 may comprise a single beam or multiple sub-beams (sometimes referred to as beamlets), and preferably comprises a large number of sub-beams. The patterning beam 18 may be projected onto the surface 12 to illuminate an area on the surface 12 referred to herein as the 'beam grid'. Where the patterning beam 18 comprises multiple sub-beams, the sub-beams are preferably directed to spots on the surface 12 arranged in a grid formation to form the beam grid 60 on the surface.

In order define the position/orientation of the beam grid 60 with respect to the surface 12, an origin or reference point 64 of the beam grid 60 may be defined, for example as the nominal focal position of a reference beam (either real or imaginary) positioned at the least-squares grid fit through all sub-beams of the beam 18 in the beam grid 60. An x and y-axis of the beam grid 60 may also be defined, for example the x-axis running through the origin and parallel to the rows of sub-beams on the beam grid, and the y-axis running through the origin and perpendicular to the x-axis. A z-axis may also be defined, e.g. perpendicular to the level sensor plane of the level sensing system 19 or the focal plane of the patterning beam 18. This coordinate system is defined in relation to the beam grid 60 and is referred to herein as the beam grid coordinate system.

In FIG. 1 an embodiment of a chuck position sensor system is shown, comprising a differential interferometer 15. The differential interferometer may use two mirrors, a chuck position mirror 14 fixed to the chuck and a final projection system position mirror 16 which may be fixed to the support 63 or fixed to the final projection system 11. In this way the interferometer is arranged to detect movements and measure position of the chuck 13 with respect to the final projection system 11. The chuck position sensor system may comprise more than one differential interferometer in order to measure the position of the chuck in more than one direction, e.g. an x-axis differential interferometer arranged for measuring chuck position in the x-direction and a y-axis one for measuring chuck position in the y-direction. The interferometers 15 may be 3-axis interferometers. It will be understood that also other types of chuck position sensor systems may be used for determining a position of the chuck 13 with respect to the final projection system 11.

FIG. 1 also shows a portion of an embodiment of an alignment sensing system 17, which is arranged for detecting a position mark on a surface. Such a position mark may be provided on a surface of chuck 13, i.e. a chuck position mark, or it may be provided on a surface of a target, i.e. a target position mark.

FIG. 1 also shows a portion of an embodiment of a level sensing system 19. The level sensing system 19 is arranged for detecting distance between a level sensor and surface 12, to determine a position of the surface 12 in the z direction. The level sensing system 19 may comprise sensors, e.g. capacitive sensors, arranged on the support 63 and/or on the final projection system 11, and/or in other suitable locations. The sensors of the alignment sensing system 17 and the level sensing system 19 are preferably in a fixed spatial relation to the final projection system 11 and beam grid 60.

A measurement system 10 may be provided, receiving inputs and/or measurements from the chuck position measurement system 15 and/or the alignment sensing system 17 and/or the level sensing system 19 and/or the beam measurement system.

Figure 2:
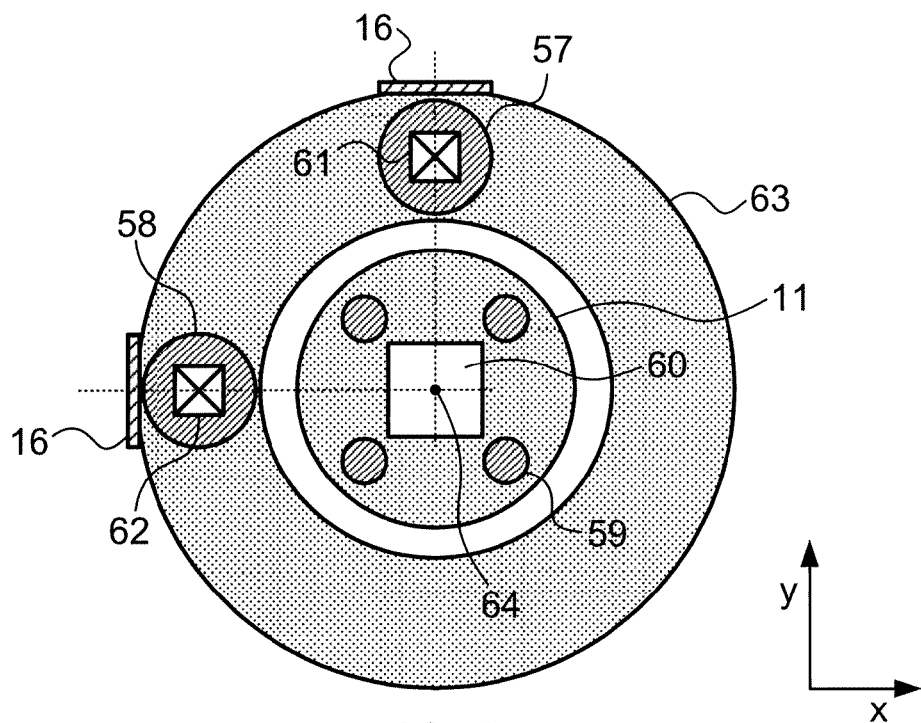
FIG. 2 schematically depicts an arrangement of alignment sensors and level sensors of an embodiment of the invention.

FIG. 2 depicts a part of a cross-section of an embodiment of a lithography system according to the invention. FIG. 2 shows an arrangement of the final projection system 11 and support 63, in the form of a ring in this embodiment, and various portions of the alignment sensing system 17. The arrangement is shown as if viewed from the beam source of the column, looking at the target, for simplicity of comparison with the coordinates shown in the other drawings.

In this embodiment the alignment sensing system 17 comprises two alignment sensors 61, 62 and the level sensing system 19 comprises six level sensors 57, 58, 59. The final projection system 11 is depicted with square beam grid 60, although rectangular, rhomboid, hexagonal, circular or other shaped beam grids may be used. Level sensors 59 may be arranged on the bottom surface of the final projection system 11 in close proximity to the beam grid 60. The support 63 supports alignment sensors 61, 62 and level sensors 57, 58, and may also support interferometer mirrors 16.

An x and y-axis of the beam grid coordinate system is shown in FIG. 2. In this embodiment, a first alignment sensor 61 and first level sensor 57 are arranged along the y-axis and a second alignment sensor 62 and second level sensor 58 are arranged along the x-axis. The alignment sensors 61, 62 and level sensors 57, 58 are mounted in an essentially fixed spatial relation to the origin 64, with the beam axes of alignment sensors 61, 62 at a fixed distance from the origin 64 of the beam grid 60.

The support 63 may be suspended from a frame 71. In FIG. 1, it is depicted how the support 63 may be connected to frame 71 via three flexures 72 (only two flexures are shown in FIG. 1). At least three flexures may be required to define the position of the ring in space. The flexures 72 may comprise a resilient material or struts with hinged or flexible joints or with connections to the frame 71 and/or support 63 which can flex. The flexures 72 may be glued in recesses in the support 63, as illustrated in FIG. 1. It may be understood from FIGS. 1 and 6, that if the final projection system expands in a radial direction (i.e. perpendicular to the axis of patterning beam 18) due to thermal expansion caused by temperature variations for example, the expansion will not move the beam axis with respect to the surface 12. The support 63 may also expand in a radial direction due to thermal expansion which would move the alignment sensors and level sensors with respect to the beam origin 64. The support 63 may comprise a low thermal expansion material, such as glass-ceramic, Pyrex and/or Zerodur to reduce this effect. Because of the flexures 72, any such expansion of support 63 would not cause an expansion force in the radial direction on frame 71. Likewise, any expansion of frame 71 in a radial direction would not cause an expansion force on the support 63 because of the flexures 72. This enables the frame 71 to be constructed using a high thermal expansion material, such as aluminium, without having an undue affect on position of the alignment and level sensors with respect to the beam grid.

Figure 3:
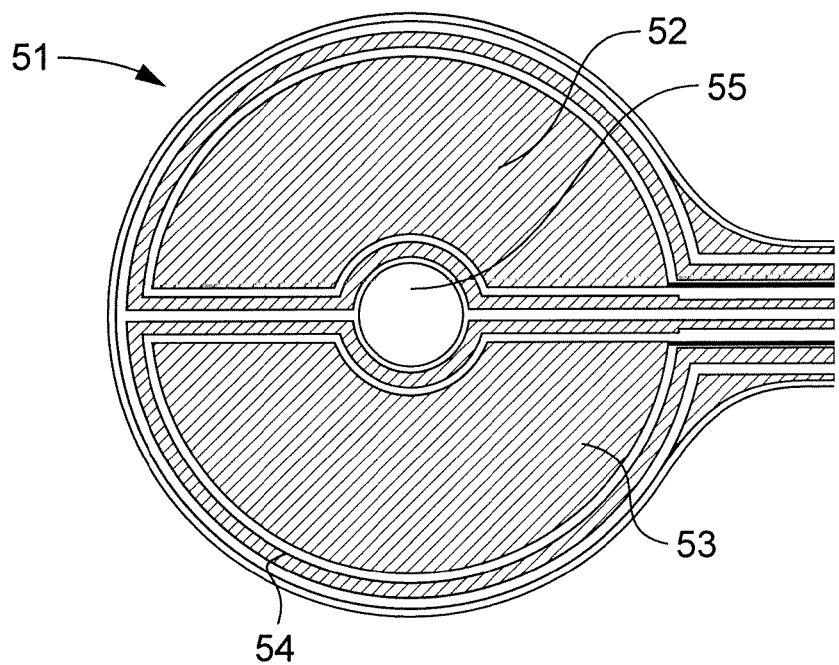
FIG. 3 schematically shows a view of a differential capacitive sensor according to an embodiment of the invention.

FIG. 3 shows schematically a view of an embodiment of a differential capacitive sensor 51 which may be used in the level sensing system 19 in an embodiment of the invention. The capacitive sensor may comprise a first measuring electrode 52, a second measuring electrode 53 and guard electrode 54, all electrically insulated from each other. The electrodes 52, 53 and guard 54 may each be formed as a thin layer comprising a metal such as copper. The first and the second measuring electrode may both have a half-moon like shape and may have between them an opening 55. The electrodes 52, 53 and guard 54 may be connected to a processing unit of a differential capacitive height measurement system (e.g. height measurement system 40 shown in FIG. 1) arranged for determining a distance and/or tilt measurement. For determining tilt, two pairs of measuring electrodes may be required, e.g. two sensor structures as shown in FIG. 3.

The opening 55 may be arranged such that an alignment light beam and a reflected alignment light beam may pass through the opening 55 during the operation of one of the alignment sensors. Due to this arrangement, the distance measurement of the differential capacitive sensor 51 can be made under the center of opening 55, at the location of the beam axis of the alignment sensor, so that a level measurement can be made at the location where the alignment sensor is reading. Also tilt may be measured at the center of opening 55, using two pairs of measuring electrodes. These may be arranged one on top of the other and both may be arranged around the opening 55. An orientation of the first pair of measuring electrodes may be shifted with respect to an orientation of the second pair of measuring electrodes, for example by 90 degrees.

The level sensing system 19, e.g. using capacitive sensors, may be capable of absolute distance measurement. In this case, the sensors of the level sensing system 19 may be calibrated to generate a known reading, e.g. a zero reading, at a level sensor plane. The level sensor plane may be generally in the x, y plane and the calibration performed so that the level sensor plane coincides as closely as possible with the focal plane of the patterning beam 18.

Figure 4:
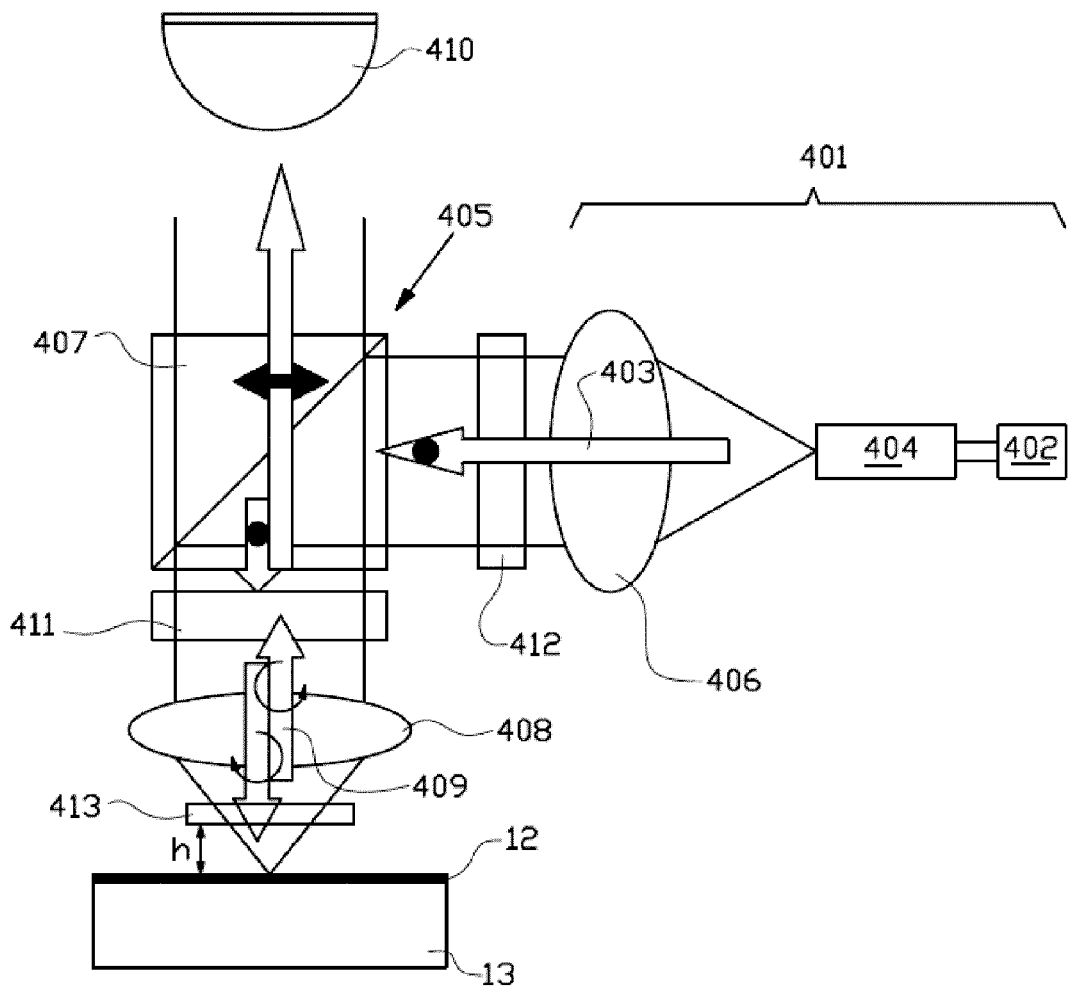
FIG. 4 is a schematic diagram of an alignment sensor according to an embodiment of the invention.

FIG. 4 shows schematically an overview of an alignment sensor according to an embodiment of the invention. The light source 401 may comprise a laser 402 for providing an alignment light beam 402. The laser 402 may be arranged for providing an alignment light beam 403 with a wavelength in the range of 600-650 nm, or about 635 nm. The light source 401 may further comprise an optical fiber 404 for guiding the light beam 403 from the laser 402 towards the optical system 405. The alignment light beam leaving the optical fiber 404 may have nearly perfect Gaussian profile and may be easily collimated. The light source may comprise a collimator lens 406 arranged for collimating the light beam 403 from optical fiber 404. However, when a fiber is not used and the laser or another light generating device provides a collimated light beam, such a collimating lens 406 may not be required.

In another embodiment, the light source 401 is arranged to provide a Bessel light beam. A Bessel light beam may be characterized in that in a spot of a Bessel light beam, the energy profile (e.g. intensity as function of the distance from the center) may be described with a Bessel function instead of a Gaussian function. An advantage of a Bessel light beam is that the spot may be small, while the depth of focus is large.

The optical system 405 may further comprise a beam splitter 407, for directing the light beam 403 towards surface 12. The optical system 405 may comprise a focus lens 408 for focusing alignment light beam 403 on the surface 12. The reflected alignment light beam 409 is generated by reflection on the surface 12 of the alignment light beam 403. The focus lens 408 may also be used for collimating the reflected beam 409. The beam splitter may then direct reflected beam 409 towards the light intensity detector 410.

The light intensity detector 410 may comprise a photodiode or an un-biased silicon PIN diode working in the photovoltaic mode. This mode may lower the amount of heat generated with respect to a biased mode operation of a photodiode. The light intensity detector may also comprise an operational amplifier to convert the current from the photodiode into a voltage which may be filtered. The filtered voltage may be converted to a digital signal, that may be used by a processing unit, for example a processing unit of the alignment sensing system 17. The active area of the light intensity detector 410 may be larger than the diameter of the reflected alignment light beam 409 leaving the beam splitter 407.

Another focus lens (not shown in FIG. 4) may be positioned between the beam splitter 407 and light intensity detector 410 to focus the reflected alignment light beam on the active area, in order to use all the energy leaving the beam splitter 407. In a non-polarizing beam splitter it may be the case that 50% of the alignment light beam 11 is directed towards the surface 12, while the other 50% may be lost. And of the reflected alignment light beam only 50% may be directed to the light intensity detector, while the other 50% may be lost. This implies that 75% of the alignment light beam 403 is lost, i.e. is not used for the position detection. Therefore, a polarizing beam splitter 407 may be used in an embodiment of the alignment sensor. In that case, the light source may provide a polarized alignment light beam 403. The light source may comprise a polarizer 412 arranged for transforming a non-polarized light beam into a polarized light beam.

Alignment light beam 403 may be an S10 polarized light beam, which is indicated in FIG. 4 by a dot. The polarizing beam splitter 407 may be arranged for guiding the S-polarized alignment light beam towards the surface. The optical system may further comprise a quarter wave plate 411, which may be located between the polarizing beam splitter 407 and the focus lens 408. When the alignment light beam 403 travels through the quarter wave plate 411, it may change its polarization from S-polarization into a right circular polarization, as is indicated by a curved arrow in FIG. 4.

When the alignment light beam 403 is reflected by the surface 12, polarization may change again; the reflected alignment light beam 409 may have a left circular polarization, as is indicated by another curved arrow in FIG. 4. When the reflected alignment light beam 408 travels through the quarter wave plate 411, it may change its polarization from left circular polarization into a P-polarization which is indicated by a straight arrow in FIG. 4. Polarizing beam splitter 407 may be arranged to guide the P-polarized reflected alignment light beam towards the light intensity detector 410. The use of a polarized alignment light beam, a polarized reflected alignment light beam and a polarizing beam splitter may result in a reduction of stray light, back reflection and energy loss in the beam splitter. Furthermore, the polarizing filter 412 may be arranged to minimize reflection of light back into the light source.

In an embodiment of the alignment sensor, the focus lens 408 is arranged to focus alignment light beam 403 on surface 12 in cooperation with a transparent plate 413, which may refract both the alignment light beam 403 and the reflected alignment light beam 409. The refraction depends on the material of the transparent plate 41.

A height measurement system 40 may be provided to measure the distance h between the alignment sensors and the surface 12 and/or the tilt of the alignment sensors with respect to the surface. With information about the distance h between the alignment sensor and the surface and/or the tilt of the alignment sensor with respect to the surface, and the actuator may be arranged for moving the chuck to adjust the distance h and/or the tilt. Such a height measurement system may be an optical height measurement system or a capacitive height measurement system, and may be separate from or part of the level sensing system 19.

A differential capacitive sensor such as the sensor 51 shown in FIG. 3 may be arranged on the transparent plate 413 shown in FIG. 4, wherein the differential capacitive sensor is facing the surface 12. This sensor may be used in the height measurement system or the level sensing system 19. In this arrangement, the distance between the capacitive sensor and the focal plane of the alignment sensor beam 403 (where the surface 12 is ideally positioned) may be minimal, which is advantageous since the performance of the capacitive sensor decreases as the distance increases between the sensor and the object it is facing, in this case the surface 12.

In an embodiment, the alignment sensing system 17 comprises two alignment sensors, such as sensors 61, 62 shown in FIG. 2, and each alignment sensor may be in accordance with embodiments described in this document. With two alignment sensors the position of a surface with two position marks may be easily determined in two dimensions, e.g. in an x-direction and a y-direction, or in a deflection direction and a scan direction. The scan direction or axis may relate in electron beam lithography to the direction in which the target, such as a wafer, is mechanically moved during the patterning, while the deflection direction or axis may relate to the direction in which the patterning beam (or sub-beams) is deflected during the patterning.

As noted above, the chuck 13 may be moveable in at least one dimension or direction, and preferably in two (e.g. x, y) or three (e.g. x, y, z) dimensions. The chuck 13 may also be moveable in at least one rotational (e.g. Rz), two rotational (e.g. Ry, Rz) or three rotational directions (e.g. Rx, Ry, Rz).

FIG. 5 shows one possible definition of these directions in a lithography system, showing x, y and z directions and Rx, Ry and Rz rotational directions. In this arrangement, movement in the x-direction represents a horizontal translation of the chuck, in the y-direction a horizontal translation of the chuck in another direction (which may be perpendicular to the x-direction), and in the z-direction a vertical translation of the chuck (which may be perpendicular to the x- and y-directions). Movement in the Rx-direction represents a rotation of the chuck about the x-axis, in the Ry-direction a rotation of the chuck about the y-axis, and in the Rz-direction a rotation of the chuck about the z-axis. FIG. 5 also indicates a definition of the sign for each direction, e.g. a positive direction in the direction of the arrows, so that both positive and negative movement in a particular direction may be defined.

The definition of directions depicted in FIG. 5 may be used for different coordinate systems for the lithography system, for example for a chuck coordinate system for defining positions and movements relative to the chuck 13, for a target coordinate system for defining position and movements relative to a target 23, and for a beam coordinate system for defining positions and movements relative to the beam grid 60 and origin 64. However, these different coordinate systems may use different definitions of the directions.

A chuck coordinate system may be defined by the average plane through the chuck mirrors 14 and the nominal plane of the surface 12 of the target 23. In this embodiment, the x- and y-axis are defined as the intersection between the average mirror surfaces and the target surface plane. The vertical z-axis is defined as perpendicular to the average target surface level. The origin of the chuck coordinate system lies at the intersection of the target surface plane and the designed (geometrical) center of a target positioned on the chuck. In this embodiment, the vertical position of the origin of the chuck (in the z-direction) may vary from target-to-target. Also, since the x- and y-axes of the chuck coordinates need not to be orthogonal in this embodiment, rotations between the chuck and beam coordinates in Rz direction may be measured as the angle between the y-axes of both coordinate systems.

The measurement system 10 may be arranged to report the position of the chuck 13 and/or the target 23 with respect to the beam grid 60, e.g. with respect to the origin 64 of the beam grid and/or one or more axes of the beam grid. For example, a coordinate system of the measurement system 10, e.g. having coordinates [x, y, z, Rx, Ry, Rz], may refer to coordinates [x, y, z] of a chuck coordinate system currently positioned at the origin 64 of beam grid 60 (i.e with the origin of the chuck coordinate system at the origin 64 of the beam grid 60), and rotations [Rx, Ry, Rz] of the chuck measured with respect to the origin and axes of the beam grid. The measurement system 10 may use measurement inputs from the chuck position measurement system 15, the alignment sensors 61, 62, the level sensors 57, 58, 59, and/or the beam measurement sensor 20 to report these positions.

The measurement system 10 coordinate system may define a transformation between chuck coordinates (i.e. coordinates relative to the chuck) and beam grid coordinates (i.e. coordinates relative to the beam grid). For the horizontal plane, the measurement system coordinate system in [x, y, Rz] may be defined as the transformation in x, y and Rz directions from beam grid coordinates to chuck coordinates. The measurement system 10 may report the chuck coordinates as observed, in the x-y plane, at the origin 64 of the beam grid 60. For the vertical plane, the measurement system coordinates [z, Rx, Ry] define the transformation from chuck coordinates to beam grid coordinates. The measurement system may report the height and tilt of the target with respect to the beam grid coordinate system. The (sign) definitions of the measurement system coordinate system may be as shown in FIG. 5.

The embodiments of the invention are described according to this arrangement, although many other coordinate systems may be used to describe the measurement and movement directions described herein, and the invention is not limited to the particular arrangement shown in FIG. 5.

FIG. 6A shows a schematic top view of an embodiment of a chuck 13. The chuck 13 is provided with a beam measurement sensor 21 and chuck position marks 22 combined in a single unit 20. In the embodiment shown in FIG. 6A, the chuck position marks 22 are in the form of gratings oriented in the x- and y-direction gratings arranged in the but any other number of chuck position marks 22 may also be provided.

The beam measurement sensor 21 in FIG. 6A has a circular shape but it may also have a rectangular shape or another shape. The chuck 13 may be supporting target 23, for example a wafer. The surface of the target may be provided with four target position marks 76, 77. The target position marks 76, 77 are arranged around an exposure field 70. A target usually comprises many exposure fields 70. An exposure field 70 may have a rectangular shape. The four target position marks 76, 77 may be positioned at the ends of the sides of the rectangular shape or other locations, but preferably none of the target position marks is adjacent to another. The chuck 13 in this embodiment is provided with two chuck position mirrors 14, mounted on sides of the chuck so the mirrors are perpendicular to each other. The chuck 13, and thus also the beam measurement sensor and the target, may be movable in at least the x- and a y-direction.

The chuck 13 is also provided with a reference plate 25 which comprises a surface 26 and chuck position marks 27, 28. The chuck position marks 27, 28 are preferably arranged at nominally the same separation as the separation between the first and second alignment sensors 61, 62, and preferably in the same spatial arrangement. The chuck position marks may be 2-dimensional marks, e.g. for reading and alignment in the x- and y-directions. Two 2-dimensional marks may be used for the two alignment sensors as depicted in the embodiment in FIG. 6A. Another option is to use 1-dimensional chuck position marks, using two 1-D marks per alignment sensor, as depicted in the embodiment shown in FIG. 8.

FIG. 6B shows a schematic top view of a spatial relationship between alignment sensors 61, 62 and beam grid 60 in an embodiment of the invention. The arrangement is shown as if viewed from the beam source of the column, looking at the target, for simplicity of comparison with the coordinates shown in the other drawings. As can be seen in FIGS. 6A and 6B, the separation and spatial arrangement of the chuck position marks 27, 28 may coincide with the separation and spatial arrangement of the alignment sensors 61, 62 and beam grid 60, although some error in separation and/or spatial arrangement may occur.

Figure 7:
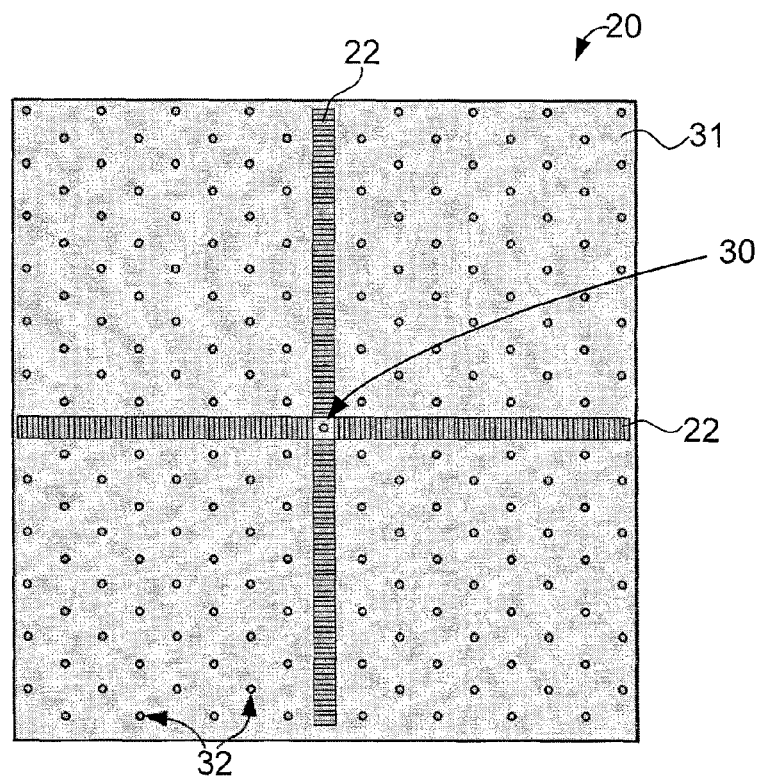
FIG. 7 shows a schematic top view of an embodiment of a beam measurement sensor.

FIG. 7 shows a schematic top view of the beam measurement sensor 21. The beam measurement sensor may comprise a (measuring) surface 31 which may be arranged for detecting an intensity of an incident beam as a function of the position it is incident on the surface 31. The beam measurement sensor may also comprise chuck position marks 22 and a number of beam blocking structures 32 arranged in a two dimensional pattern on the surface 31. The patterning beam 18 may comprise several sub-beams, and the pattern of blocking structures may be arranged with a pitch corresponding to a nominal distance between adjacent sub-beams in the beam grid 60 projected on the surface 31. In that case, each sub-beam may be scanned over a corresponding blocking structure 32 to identify one or more relevant sub-beam parameters, such as sub-beam position.

The spatial relationship between the two-dimensional pattern forming the chuck position mark 22 and the two-dimensional pattern of charged particle blocking structures have a predetermined relationship with each other. Preferably, the spatial relationship between the two patterns is such that the center 30 of the chuck position marks 22 coincides with geometric center of the two-dimensional pattern of blocking structures 32. The geometric center of the pattern of blocking structures may be defined as the position at which the sum of the squares of the distances towards all surrounding blocking structures is minimal.

Figure 8:
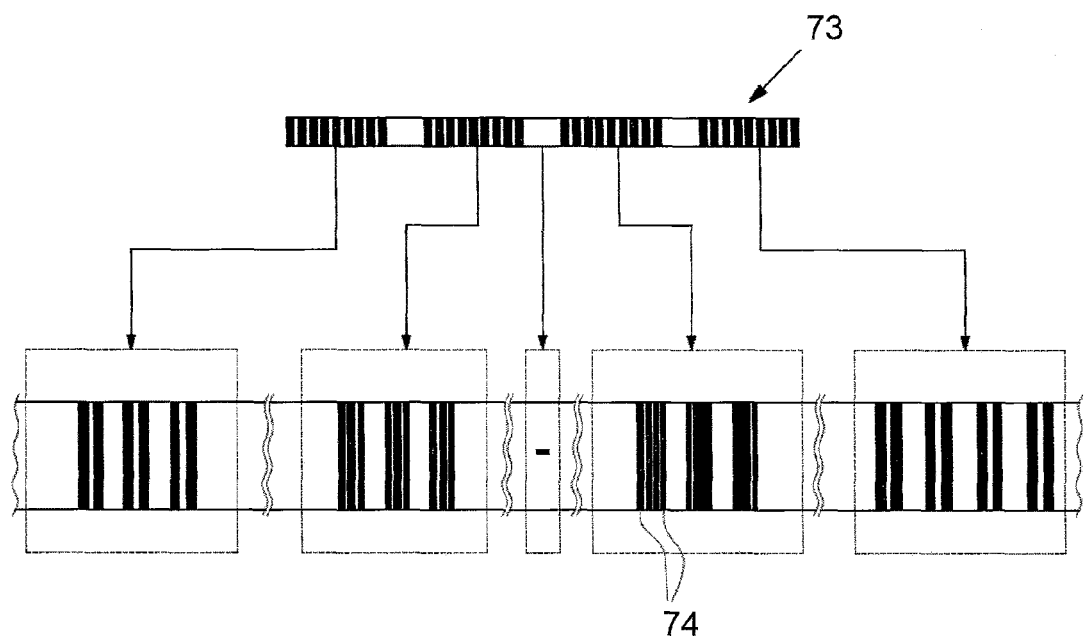
FIG. 8 shows a schematic overview of a position mark, such as a target position mark or a chuck position mark, according to an embodiment of the invention.

FIG. 8 shows a schematic overview of a position mark 73, such as a target position mark or a chuck position mark, according to an embodiment of the invention. The position marks 73 are designed to provide a mark which can be accurately detected by the alignment sensors 61, 62. The position marks may include edges or transitions from one area to another area that can be detected by the alignment sensors, e.g. by affecting a light beam reflected from the mark and received by the alignment sensors. The position marks may include several such edges or transitions to enable the alignment sensors to distinguish different positions or orientations of the positions marks. The position mark 73 may comprise several areas 74, wherein a first reflective area has a higher reflection coefficient than a second reflective area, or vice versa. Alternatively or additionally the areas 74 may comprise a first raised area and second non-raised area, so that the first and second areas can be distinguished from one another, e.g. by an interference pattern or phase of a light beam reflected from the areas.

Figure 9:
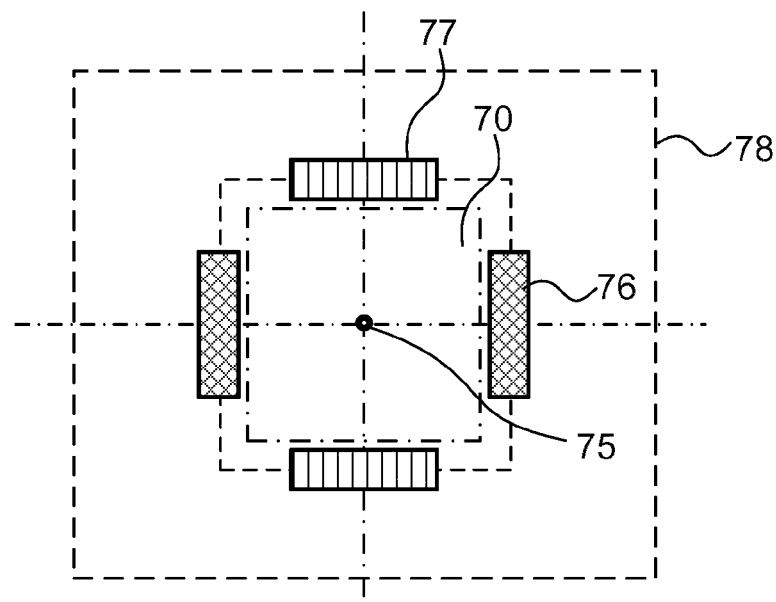
FIG. 9 shows a schematic overview of an arrangement of position marks, according to an embodiment of the invention.

FIG. 9 shows a schematic overview of an arrangement of target position marks 76, 77 according to an embodiment of the invention. The target may require multiple patterns to be formed on its surface, and the target position marks 76, 77 may be formed on the target during patterning of the first pattern formed on the target so that the marks are in a fixed spatial relationship with the first pattern. Subsequent patterns formed on the target can be aligned with patterns previously formed on the target so that all of the patterns are aligned with each other.

The target position marks 76, 77 may be arranged around a field 70 on the target. The target position marks may be arranged with two marks 76 positioned on one axis of the target, e.g. an x-axis, and two marks 77 positioned on another axis of the target, e.g. a y-axis. A minimal separation distance between the target position marks for each axis permits more accurate measurement of the position and tilt and the surface of the target. In one embodiment, the target position marks for each axis are separated by at least 26 mm.

In the embodiment shown in FIG. 9, four target position marks are arranged within a specified distance from the center of the target within an area 78, e.g. within ±33 mm of the center of the target. Two marks 76 are arranged on an x-axis of the pattern on the target and two marks 77 arranged on a y-axis of the pattern on the target. The target position marks may be located in the scribe lanes between the fields on the target surface.

To achieve overlay, it is important to be able to reproduce the beam grid to alignment sensor vector at any position of the chuck. This reproducibility is much more complex if the chuck rotates in between different alignment sensor measurements or between beam sensor measurements and alignment sensor measurements. To keep the procedure as simple as possible, the Rx, Ry and Rz position of the chuck may be fixed for all alignment sensor and beam sensor measurements.

A chuck initialization procedure may be used to enable the lithography system to accurately measure movements of the chuck 13 and keep track of chuck position. Where the chuck position sensor system uses differential interferometers, the system needs to be initialized in order to be able to determine the current position of the chuck 13, since the interferometers only measure relative position. Chuck initialization may be performed if certain parts of the lithography system are replaced or when an interferometer has lost its measurement signal. An example of an initialization procedure is described below and depicted in FIGS. 10A and 10B.

Specific chuck positions, for example the chuck positions required for beam position measurement and the wafer position on the chuck, are calibrated in measurement system coordinates. It is for reproducibility of these chuck movements that each time, the same measurement system coordinates refer to the same position of the chuck under the beam grid 60 and/or alignment sensors 61, 62.

The actuator system for moving the chuck may have sensors or encoders to determine a rough location of the chuck. The initialization may begin with a coarse initialization procedure to bring the chuck 13 into a known position within sufficiently accurate limits that further chuck 13 movement can be controlled using the measurement data from the chuck position measurement system, e.g. the interferometers.

Figure 10A:
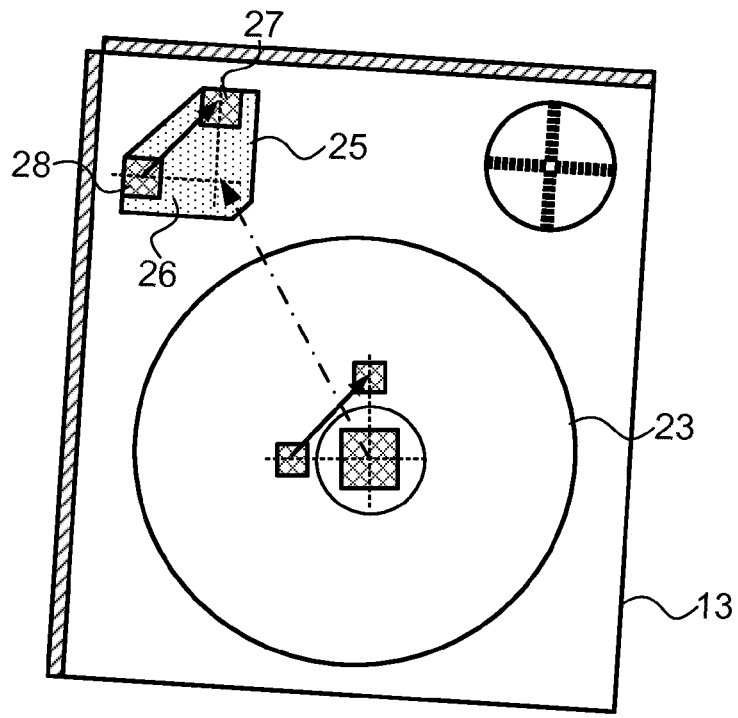
FIGS. 10A-10B show a schematic overview of a first portion of a measurement and alignment procedure according to an embodiment of the invention.
Figure 10B:
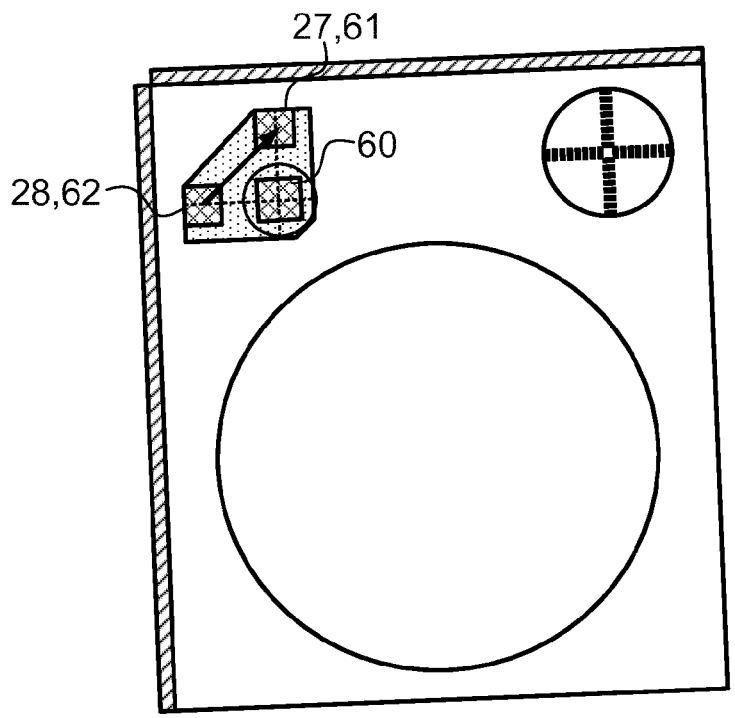

In a first step of the chuck initialization, depicted in FIG. 10A, the chuck 13 is moved to position the chuck position marks 27, 28 on the reference plate 25 with the alignment sensors 61, 62. This may be accomplished by moving the chuck 13 to a position where the chuck position marks 27, 28 can be read by the alignment sensors 61, 62. The actuator system moves the chuck 13 to obtain a best fit alignment of the chuck position marks to the alignment sensors, as depicted in FIG. 10B. For example, four mark readings may be taken of the position of the marks 27, 28, one in the x-direction and one in the y-direction for each of the two alignment sensors 61, 62, and the chuck moved in the x- and y-directions and rotated in the Rz-direction (about the z-axis) to a position minimizing the sum of the squares of the deviations in the positions of the marks 27, 28 from the positions of the alignment sensors 61, 62. This defines known x, y and Rz positions of the chuck 13 in relation to the alignment sensors 61, 62.

In a second step, while the chuck 13 is positioned with the reference plate 25 under the alignment sensors 61, 62, the level sensors measure distance to the surface 26 of the reference plate. Based on this level measurement, the chuck 13 is moved in the z-direction and rotated in the Rx-direction and Ry-direction as necessary so that the reference plate surface 26 is in the level sensor plane. This defines known z, Rx and Ry positions of the chuck 13 in relation to the alignment level sensors 61, 62.

In a third step, the chuck position system is initialized with the chuck 13 at this position, e.g. the measurement values obtained from the interferometers 15, 16 at this chuck position may be stored as the chuck initialization position in the x, y, z, Rx, Ry and Rz dimensions. For example, this may be represented as coordinates $[x, y, z, Rx, Ry, Rz]_{init}$. Note that the measurement values and these coordinates represent the position of the chuck with respect to the position of the alignment sensors.

The reproducibility of the chuck initialization position influences the reproducibility of calibrations of the metrology system of the lithography system, and it also impacts the accuracy of all other position measurements, such as the beam position measurement sensor in measurement system coordinates, nominal target position in target coordinates, Rz coarse alignment accuracy, etc. The interferometer initialization position is a 6 degrees of freedom position, defining the coordinates of the chuck in measurement system coordinates when the reference plate is aligned to the alignment sensors (for x, y and Rz positions) and aligned to the level sensor plane (for z, Rx and Ry positions).

An initialization may be performed to establish the position of center of the target in relation to the alignment sensors, due to uncertainties in the alignment sensor positions and the load position of the target on the chuck.

Figure 11:
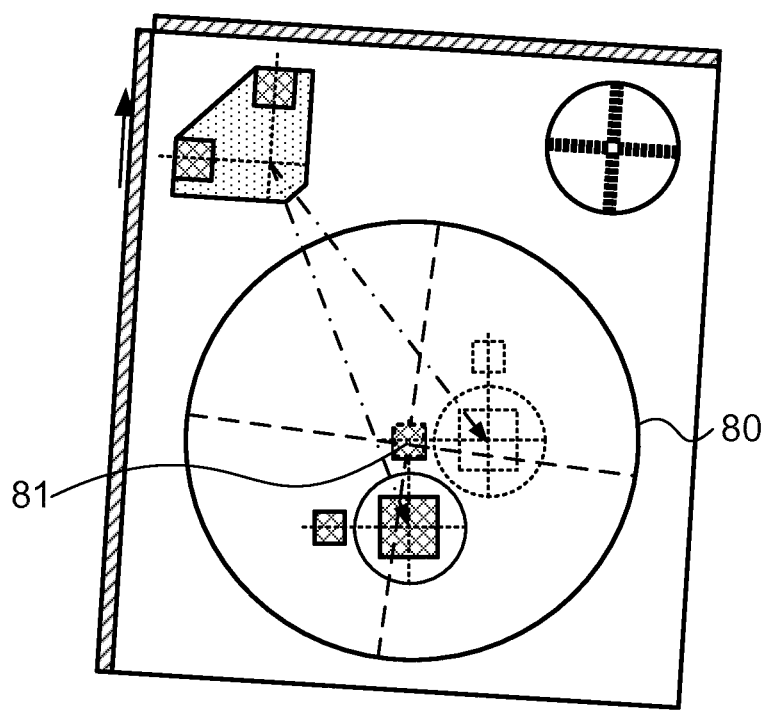
FIG. 11 shows a schematic overview of a second portion of a measurement and alignment procedure according to an embodiment of the invention.

A reference target 80 is loaded on the chuck 13, as shown in FIG. 11. The reference target is a special target having an target position mark 81 indicating its center point. The chuck 13 with the reference target 80 is positioned so that the center of the reference target is aligned under a first alignment sensor, e.g. alignment sensor 61. This first chuck position is measured and a first vector describing the first position, e.g. vector $[x, y]_{TargetCenterToFirstSensor}$ in measurement system coordinates. Next, the chuck 13 with the reference target 80 is positioned so that the center of the target is aligned under a second alignment sensor, e.g. alignment sensor 62. This second chuck position is measured and a second vector describing the second position is derived, e.g. vector $[x, y]_{TargetCenterToSecondSensor}$ in measurement system coordinates. These vectors establish the position of center of the reference target in relation to the alignment sensors.

This calibration is preferably performed once after any replacement or adjustment of the final projection system 11 or any of its components. The reference target is removed from the chuck 13 and a target to be processed is loaded on the chuck 13.

Alignment of the chuck to the calibrated mechanical scan direction may also be performed. After the chuck initialization procedure, the chuck 13 orientation still has no direct relation to either the alignment of the patterning beam 18 produced by final projection system 11 (i.e. the beam grid 60) or the alignment of the target 23 positioned on the chuck 13.

Figure 12A:
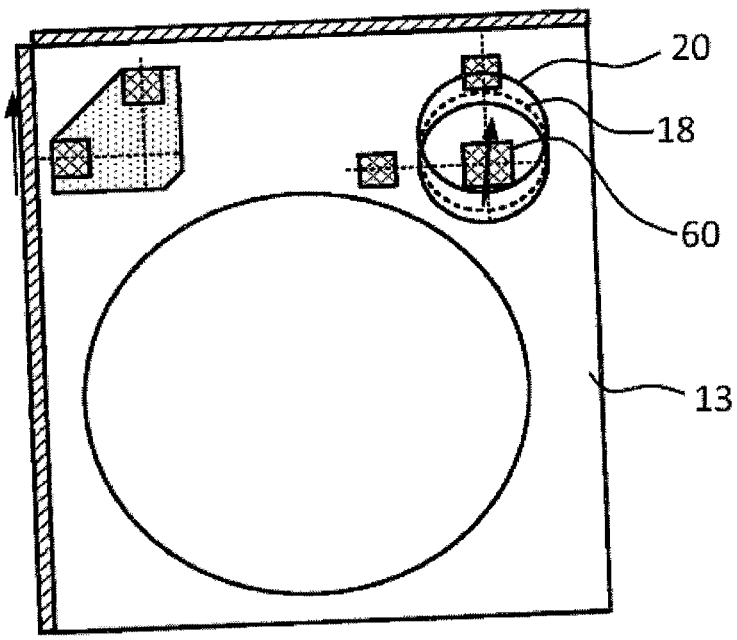
FIGS. 12A-12B show a schematic overview of a third portion of a measurement and alignment procedure according to an embodiment of the invention.

The chuck 13 is moved so that the beam 18 falls onto the beam measurement sensor 20, as depicted in FIG. 12A. Where the beam 18 comprises multiple sub-beams, a measurement of separation distance between sub-beams may be performed. For this measurement, the grid of sub-beams is swept across the blocking structure of the beam measurement sensor 20, and the resulting intensity values may be used to determine e.g. the distance between sub-beams, an average sub-beam to neighbouring sub-beam stitch vector, the size of the beam grid, and the orientation of the beam grid, in measurement system coordinates. This calibration may be performed once after each projection lens integration, or when the initialization position has become invalid, e.g. after a chuck swap or interferometer reintegration.

Figure 12B:
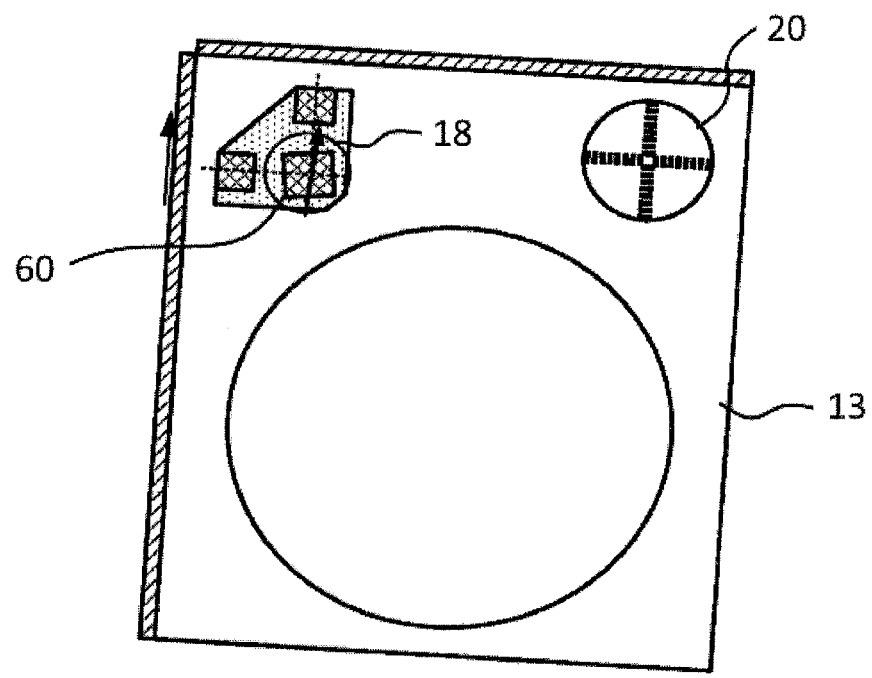

Next, the chuck 13 may be rotated in the Rz direction so that the y-axis of the chuck, which was previously determined during initialization, is aligned to a calibrated y-axis of the beam grid 60, as depicted in FIG. 12B. The current chuck 13 position now equals $[x, y, z, Rx, Ry, Rz]_{init}-[0, 0,$ 0, 0, 0, $Rz]_{BeamGrid}$. This enables a movement of the chuck in the y direction of measurement system coordinates to produce a movement along the intended mechanical scan direction, e.g. so that patterns written by neighboring beams stitch correctly to each other.

After loading target 23 onto chuck 13, the chuck is put in such orientation that the target surface (average or center) is aligned to the focal plane of the patterning beam 18, and the y-axis of the target layout is aligned to the y-axis of the beam grid. These [Rx,Ry,Rz] measurement system coordinates are used for all alignment sensor and beam position sensor measurements.

From the moment of the first until the last measurement with the alignment sensors during the expose scenario, it is important that the beam grid to alignment sensor vector remains identical. This requires that the mechanical stability of the alignment sensors to the beam grid axis remains stable. Therefore the alignment sensors are mounted in a 'low expansion ring'.

The first step of the global alignment is the tilt measurement. The tilt of the target surface with respect to the level sensor plane is measured, and then the chuck is positioned so that the target surface at the center is aligned to the focal plane of the projection lens. One method for accomplishing this is by performing in the following steps, illustrated in FIGS. 13A and 13B. It will be understood that some of the steps described herein may be performed in different order and some steps combined into a single step (e.g. omitting intermediate chuck movements) without altering the end result, for all parts of the alignment procedure.

Figure 13A:
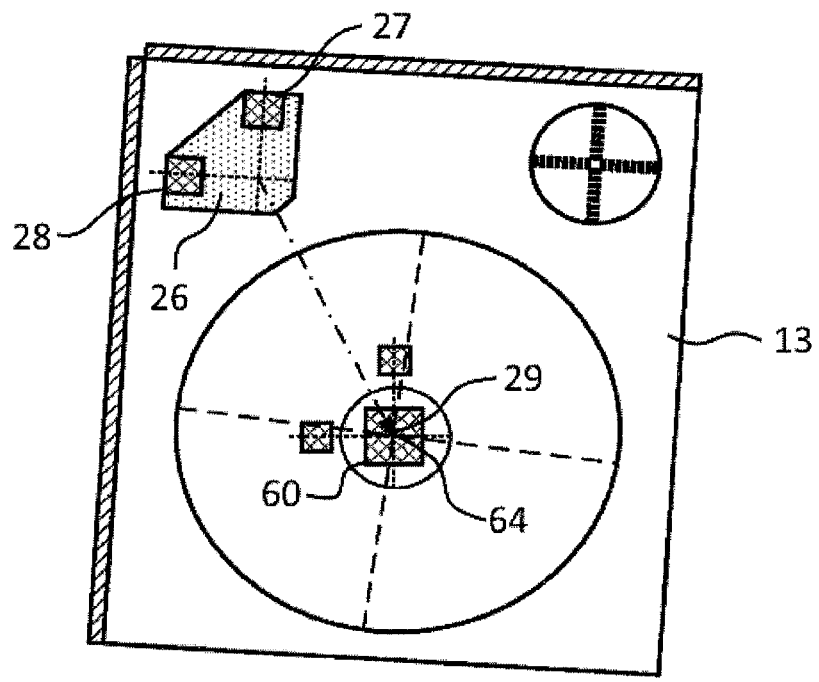
FIGS. 13A-13B show a schematic overview of a fourth portion of a measurement and alignment procedure according to an embodiment of the invention.

The chuck 13 is moved in the x- and y-directions as necessary to position the origin 29 of the chuck 13 under the origin 64 of the beam grid 60, as depicted in FIG. 13A. The chuck is also moved in the z-direction as necessary to position the origin 29 of the chuck in the focal plane of the final projection system 11. The origin 29 of the chuck has a fixed spatial relationship to the reference plate alignment marks 27, 28 and surface 26. The chuck initialization procedure enables the interferometer system to measure the position of the chuck 13 with respect to the beam grid 60, so that the origin 29 of the chuck can be aligned with the origin 64 of the beam grid 60.

Figure 13B:
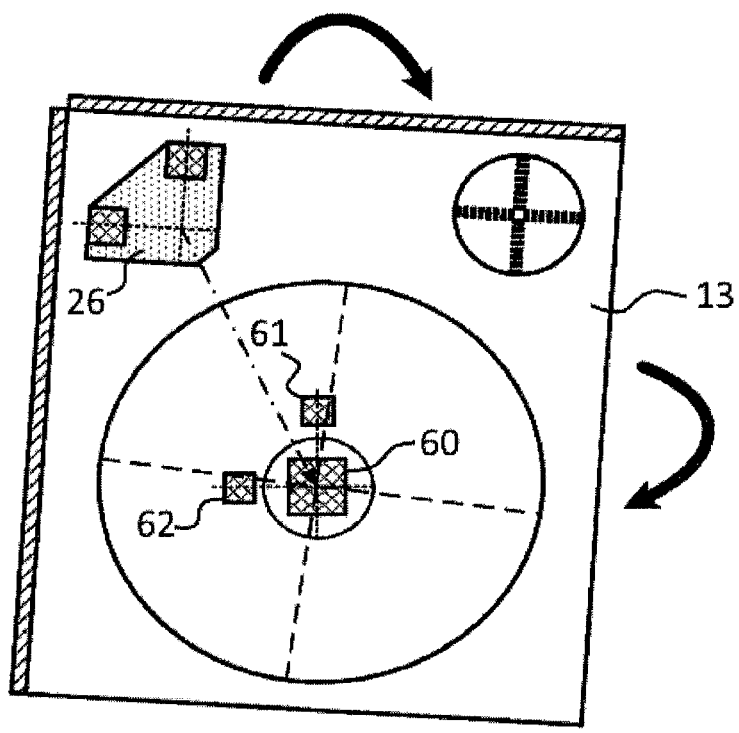

The chuck 13 is rotated in the Rx- and Ry-directions as necessary to align the reference plate surface 26 in the level sensor plane, as depicted in FIG. 13B, and the chuck is further rotated in the Rz-direction to align the y-axis of the chuck 13 to the y-axis of the beam grid 60. This are the same Rx, Ry and Rz positions as at the end of the chuck initialization, e.g. $[0, 0, 0, Rx, Ry, Rz]_{init}-[0, 0, 0, 0, 0, Rz]_{yBeamGrid}$. In this chuck position, the level of target surface 12 is measured with the alignment level sensors 57, 58. This measurement is with respect to the level sensor plane.

The level sensing system 19 may be calibrated so that the level sensor plane nominally coincides with the focal plane of the patterning beam 18. There may nevertheless be small deviations between the two planes which may be taken care during calibration. Using the calibration settings, the chuck 13 is rotated in the Rx and Ry directions as necessary to align the target surface to the focal plane of the final projection system 11.

The next step is to align the chuck so that the target layout is aligned to the y-axis of the beam grid, and to determine the position of the origin of the target. This involves a global alignment in x, y and Rz-directions. One method for accomplishing this is by performing in the following steps, illustrated in FIGS. 14A-14E.

At this point a movement along the y-axis of the measurement system coordinates is nominally equal to movement along the mechanical scan direction, but eventually the y-axis of the target layout must be aligned to the beam grid. This alignment takes place during the global alignment after the target is loaded into the tool.

Figure 14A:
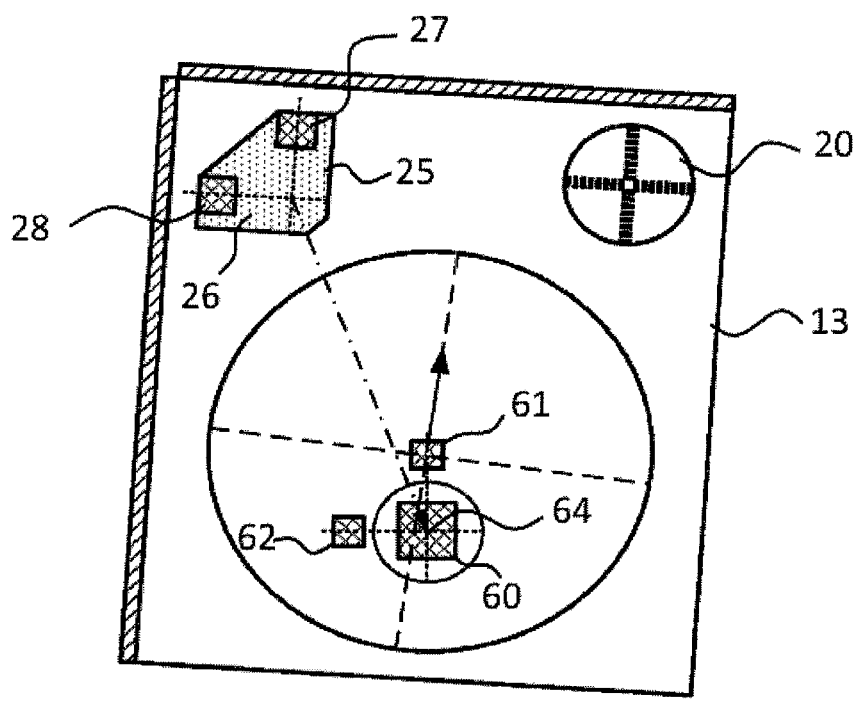
FIGS. 14A-14E show a schematic overview of a fifth portion of a measurement and alignment procedure according to an embodiment of the invention.

The chuck 13 is moved over the distance $[x, y]_{TargetCenterToSecondSensor}$ to position the center of the target under the first alignment sensor, e.g. alignment sensor 61, as depicted in FIG. 14A.

Before loading the target, the wafer load system measures the offset of the target position with respect to a 'nominal' target position. The center of the reference target is known, but the position of the center of the target to be patterned may vary slightly from the known value. The wafer load system may report how much offset there is from the reference target load. This may be done using a camera to pinpoint the target position marks when the target is loaded on the chuck in the wafer load system.

Figure 14B:
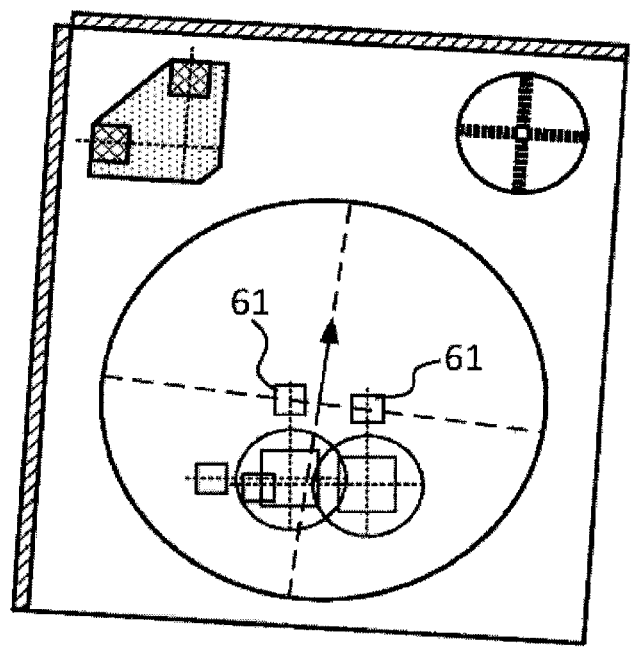

This offset plus the target coordinates of the target position marks on the target are used to calculate the scan parameters of the target position marks. The scan parameters typically include start and end positions and scan speed of a step movement. The chuck is moved to position each x-axis target position mark 76 under the first alignment sensor 61 and the actual position of the x-axis target position marks with respect to the beam gird is measured, as depicted in FIG. 14B.

Figure 14C:
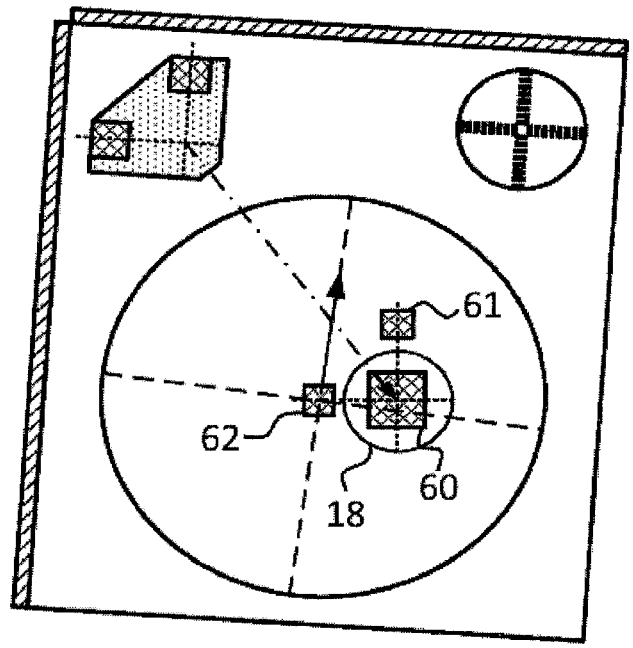
Figure 14D:
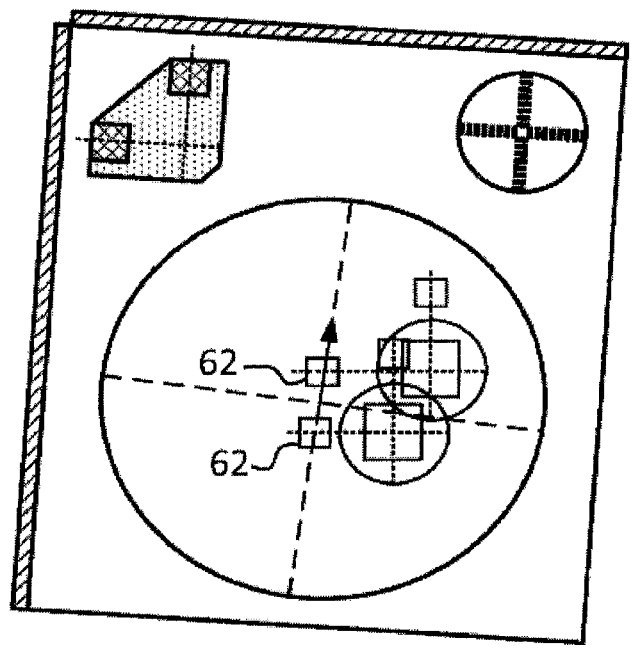

The chuck 13 is next moved over the distance $[x, y]_{TargetCenterTargetToFirstSensor}$ to position the center of the target under the second alignment sensor, e.g. alignment sensor 62, as depicted in FIG. 14C. The chuck is moved to position each y-axis target position mark 77 under the second alignment sensor 62 and the actual position of the y-axis target position marks with respect to the beam gird is measured, as depicted in FIG. 14D.

Figure 14E:
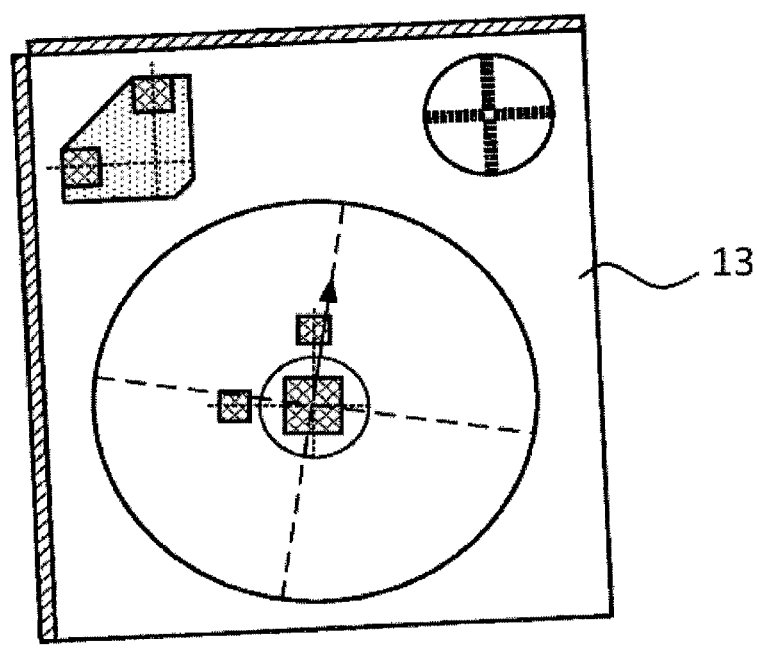

The rotation of the target layout in the Rz direction is calculated with respect to the beam grid in measurement system coordinates. The chuck 13 is rotated in the Rz-direction by the calculated amount to align the target layout coordinates to the y-axis of the beam grid, as depicted in FIG. 14E.

Together with the rotation of the target in measurement system coordinates, the shift of the target in measurement system coordinates can be calculated. This results in the transformation between target and measurement system coordinates, which can be expressed as a transformation matrix:

$$\begin{bmatrix} x \\ y \end{bmatrix}^{MES} = \underbrace{\begin{bmatrix} T_x^{Wafer} \\ T_y^{Wafer} \end{bmatrix}^{MES} + \begin{bmatrix} 1 & -R^{Wafer} + R_a^{Wafer} \\ R^{Rafer} + R_a^{Wafer} & 1 \end{bmatrix} \begin{bmatrix} x \\ y \end{bmatrix}^{Wafer}}_{\Sigma_{Global}^{Wafer \to MES\_ALS}}$$

where T is a 2×1 translation vector describing the position of the origin of the target in measurement system coordinates, and R is a 2×2 rotation matrix describing the orientation of each of the axis (x and y axes) of the target in measurement system coordinates. The transformation describes the offset of the wafer in measurement system coordinates to have a first target position mark aligned to a first alignment sensor and a second target position mark aligned to a second alignment sensor.

Figure 15:
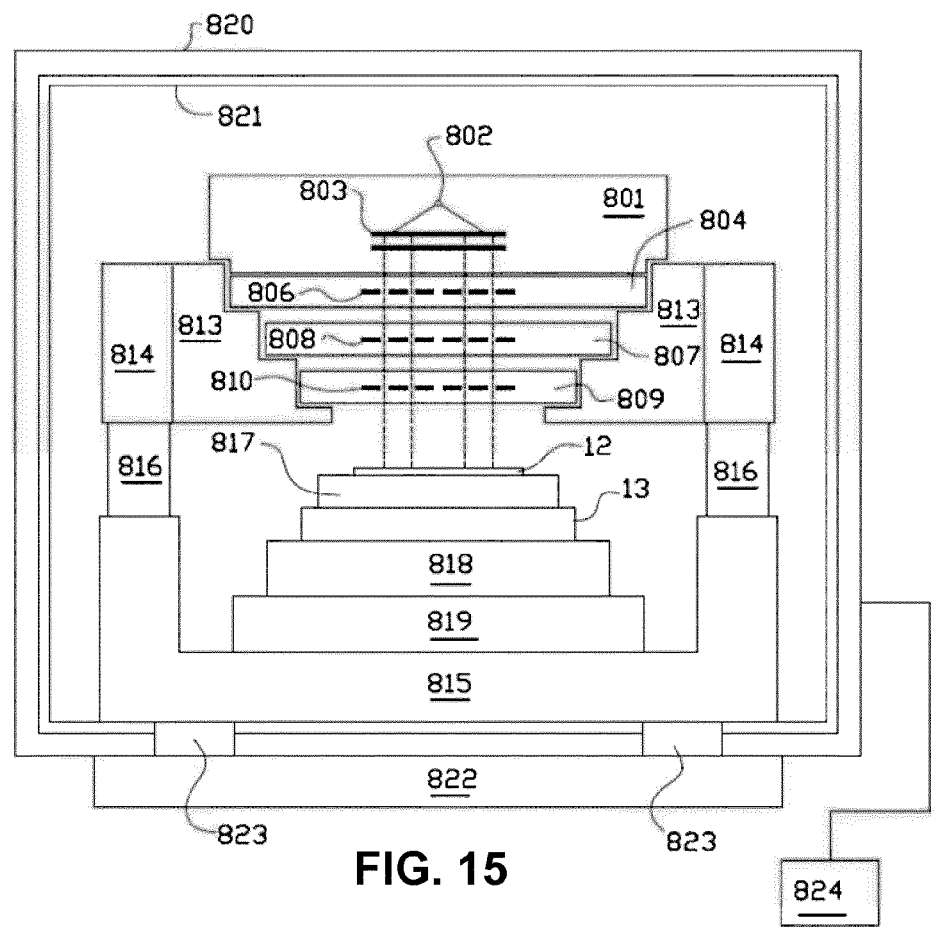
FIG. 15 shows a schematic overview of a lithography system according to an embodiment of the invention.

FIG. 15 shows a schematic overview of a lithography system according to an embodiment of the invention, which may comprise elements of a lithography system as described herein. The lithography system is preferably designed in a modular fashion to permit ease of maintenance. Major subsystems are preferably constructed in self-contained and removable modules, so that they can be removed from the lithography machine with as little disturbance to other subsystems as possible. This is particularly advantageous for a lithography machine enclosed in a vacuum chamber, where access to the machine is limited. Thus, a faulty subsystem can be removed and replaced quickly, without unnecessarily disconnecting or disturbing other systems.

In the embodiment shown in FIG. 15 these modular subsystems include an illumination optics module 801 which may comprise a beam source 802 and beam collimating system 803, an aperture array and condenser lens module 804 including aperture array 805 and condenser lens array 806, a beam switching module 807 including sub-beam blanker array 808, and projection optics module 809 including beam stop array 810, beam deflector array 811, and projection lens arrays 812. The above-mentioned final projection system may refer to the projection lens arrays 812.

The modules may be designed to slide in and out from an alignment frame. In the embodiment shown in FIG. 15, the alignment frame may comprise an alignment inner sub frame 813 and an alignment outer sub frame 814. In the above flexures have been described for connecting the final projection system with a frame 71. In FIG. 15, this connection and thus the flexures are not shown. However, the frame 71 may correspond to the alignment inner sub frame 813 or the alignment outer sub frame 814. A main frame 815 may support the alignment subframes 813 and 814 via vibration damping mounts 816. The wafer or target rests on wafer table 817, which is in turn mounted on chuck 13.

For simplicity, the wafer table 817 has not been mentioned in the above description. Chuck 13 sits on the stage short stroke 818 and long stroke 819. The stage short stroke 818 and long stroke 819 may comprise the actuator system described above. The lithography machine may be enclosed in vacuum chamber 820, which may include a mu metal shielding layer or layers 821. The system may rest on base plate 822 and may be supported by frame members 823.

The various module typically require a large number of electrical signals and/or optical signals, and electrical power to operate the module. The modules inside the vacuum chamber may receive these signals from a processor unit 824 which is typically located outside of the chamber.

The patterning beam may be collimated by collimator lens system 803. The collimated beam impinges on an aperture array 805, which blocks part of the beam to create a plurality of sub-beams. The lithography system is preferably arranged for generating a large number of sub-beams, preferably about 10,000 to 1,000,000 sub-beams. The sub-beams may pass through a condenser lens array 806 which may focus the sub-beams in the plane of a beam blanker array 808, comprising a plurality of blankers for deflecting one or more of the sub-beams. The deflected and undeflected sub-beams may arrive at beam stop array 810, which may have a plurality of apertures. The sub-beam blanker array 808 and beam stop array 810 may operate together to block or let pass the sub-beams. If sub-beam blanker array 808 deflects a sub-beam, it will not pass through a corresponding aperture in beam stop array 810, but instead will be blocked. But if sub-beam blanker array 808 does not deflect a sub-beam, then it will pass through the corresponding aperture in beam stop array 810, and through beam deflector array 811 and projection lens arrays 812.

The beam deflector array 811 may provide for deflection of each sub-beam in the x and/or y direction, substantially perpendicular to the direction of the undeflected sub-beams, to scan the sub-beams across the surface of the target. The sub-beams may pass through projection lens arrays 812 and may be projected onto the target. The projection lens arrays 812 preferably provide a demagnification in the order of to 500 times (depending of the specific electron-optical lay out). The sub-beams may impinge on the surface of target positioned on moveable chuck 13 for carrying the target.

For lithography applications, the target usually is a wafer provided with a charged-particle sensitive layer or resist layer. The lithography system may operate in a vacuum environment. A vacuum may be desired to remove particles which may be ionized by the beams and become attracted to the source, may dissociate and be deposited onto the machine components, and may disperse the beams. In order to maintain the vacuum environment, the lithography system may be located in a vacuum chamber. All of the major elements of the lithography system are preferably housed in a common vacuum chamber, including the beam source, the optical column and the moveable chuck.

It may be understood that the described embodiment of a lithography system using an electron beam to pattern a target may also be applied to a lithography system using a light beam to pattern a target, mutatis mutandis. It is to be understood that the above description is included to illustrate the operation of the preferred embodiments and is not meant to limit the scope of the invention. From the above discussion, many variations will be apparent to a person skilled in the art that are encompassed by the appended claims and are within spirit and scope of the present invention.

The invention claimed is:

1. A method for operating a target processing system for processing a target on a chuck, the method comprising:
    providing at least a first chuck position mark and a second chuck position mark on the chuck;
    providing an alignment sensing system comprising at least a first alignment sensor and a second alignment sensor arranged for detecting the first and second chuck position marks respectively;
    providing a chuck position measurement system comprising at least two differential interferometers arranged to measure the position of the chuck with respect to a final projection system of said target processing system;
    providing a level sensing system comprising a plurality of level sensors, and providing a reference surface on the chuck;
    moving the chuck to a first position based on at least one measurement of the alignment sensing system, said moving the chuck comprising moving the chuck to align the first and second chuck position marks with the first and second alignment sensors and reading the first and second chuck position marks by the first and second alignment sensor;
    measuring at least one value relating to the orientation of the reference surface with respect to the level sensors, and moving the chuck to align the reference surface with a level sensor plane of the plurality of level sensors, such that in the first position the first and second chuck position marks are aligned with the first and second alignment sensors and the reference surface is aligned with the level sensor plane;
    measuring at least one value related to the first position of the chuck, wherein measuring at least one value related to the first position of the chuck comprises measuring an output of each of the differential interferometers; and
    initializing each of the differential interferometers with the chuck located at the first position, based on said measuring of said at least one value related to the first position of the chuck.

2. The method of claim 1, wherein the relative position of the first chuck position mark with respect to the second chuck position mark is substantially the same as the relative position of the first alignment sensor with respect to the second alignment sensor.

3. The method of claim 1, further comprising providing a final projection system arranged to project a patterning beam onto the target, and wherein the first alignment sensor is arranged at a distance from the final projection system in a first direction (y-axis) and the second alignment sensor is arranged at distance from the final projection system in a second direction (x-axis).

4. The method of claim 1, further comprising projecting a patterning beam onto the target to form a beam grid on the target, wherein the first alignment sensor is arranged for detecting a position mark at a distance from the beam grid in a first direction (y-axis) and the second alignment sensor is arranged for detecting a position mark at a distance from the beam grid in a second direction (x-axis).

5. The method of claim 1, wherein the step of moving the chuck to align the chuck position marks with the alignment sensors comprises moving the chuck in two horizontal axes (x, y-axis) and rotating the chuck about a vertical axis (Rz direction) as necessary to achieve the alignment.

6. The method of claim 1, further comprising moving the chuck to align the reference surface with a level sensor plane of the level sensors prior to measuring at least one value relating to orientation of the beam grid.

7. The method of claim 1, wherein the level sensing system comprises at least a first level sensor arranged at a distance from the final projection system in a first direction (y-axis) and a second level sensor arranged at distance from the final projection system in a second direction (x-axis).

8. A target processing system for processing a target on a chuck, the system comprising:
    a moveable chuck including at least a first chuck position mark and a second chuck position mark;
    an alignment sensing system comprising at least a first alignment sensor and a second alignment sensor arranged for detecting the first and second chuck position marks respectively,
    a level sensing system comprising a plurality of level sensors, and a reference surface on the chuck, said level sensing system arranged for measuring at least one value relating to the orientation of the reference surface with respect to the level sensors;
    an actuator system arranged for moving the chuck;
    a chuck position measurement system arranged for measuring a position of the chuck, the chuck position measurement system comprising at least two differential interferometers arranged to measure the position of the chuck with respect to a final projection system of said target processing apparatus,
wherein said target processing system is configured to initialize said differential interferometers by:
    using said actuator system, moving the chuck to align the first and second chuck position marks with the first and second alignment sensors, respectively, while reading the first and second chuck position marks by the first and second alignment sensor and moving the chuck such that the reference surface coincides with a level sensor plane;

wherein the position where the first and second chuck position marks are aligned with the first and second alignment sensors, respectively, and the reference surface on the chuck coincides with the level sensor plane is referred to as a first position of the chuck, using said chuck position measurement system measuring at least one value related to the first position of the chuck, wherein said measuring said at least one value related to the first position of the chuck comprises measuring an output of the differential interferometers, and initializing the differential interferometers with the chuck located at the first position based on said measuring said at least one value related to the first position of the chuck.

9. The system of claim 8, wherein the relative position of the first chuck position mark with respect to the second chuck position mark is substantially the same as the relative position of the first alignment sensor with respect to the second alignment sensor.

10. The system of claim 8, further comprising a final projection system arranged to project a patterning beam onto the target, and wherein the first alignment sensor is arranged at a distance from the final projection system in a first direction (y-axis) and the second alignment sensor is arranged at distance from the final projection system in a second direction (x-axis).

11. The system of claim 8, further comprising a final projection system for projecting a patterning beam onto the target to form a beam grid on the target, wherein the first alignment sensor is arranged for detecting a position mark at a distance from the beam grid in a first direction (y-axis) and the second alignment sensor is arranged for detecting a position mark at a distance from the beam grid in a second direction (x-axis).

12. The system of claim 8, wherein, the measurement system is arranged for measuring at least one value related to the current position of the chuck.

13. The system of claim 8, further comprising a final projection system arranged to project a patterning beam onto the target, wherein the level sensing system comprises at least a first level sensor arranged at a distance from the final projection system in a first direction and a second level sensor arranged at distance from the final projection system in a second direction (x-axis).

14. A target processing system for processing a target on a chuck, the system comprising:
a final projection system arranged to project a patterning beam onto the target to form a beam grid on the target;
a moveable chuck including at least a first chuck position mark and a second chuck position mark provided on a surface of said chuck;
an actuator system arranged for moving the chuck;
an alignment sensing system comprising at least a first alignment sensor and a second alignment sensor arranged for detecting the first and second chuck position marks respectively,
a level sensing system comprising a plurality of level sensors arranged on a bottom surface of the final projection system in close proximity to the beam grid and in a fixed spatial relation to the final projection system;
a reference surface provided on a surface of said chuck, said level sensing system arranged for measuring at least one value relating to distance and/or orientation of the reference surface with respect to said level sensors;
a chuck position measurement system arranged for measuring a position of the chuck, the chuck position measurement system comprising at least two differential interferometers arranged to measure the position of the chuck with respect to the final projection system of said target processing apparatus.

15. The target processing system according to claim 14, wherein the chuck is provided with a reference plate comprising the reference surface and the first and second chuck position marks.

16. The target processing system according to claim 14, wherein an origin of the chuck has a fixed spatial relationship to the first and second chuck position marks and the reference surface.

17. The system of claim 14, wherein the level sensing system further comprises a second plurality of level sensors, wherein the first alignment sensor and a first of said second plurality of level sensors are arranged at a distance from the final projection system in a first direction and the second alignment sensor and a second of said second plurality of level sensors are arranged at distance from the final projection system in a second direction.

* * * * *